(12) United States Patent
Lloyd et al.

(10) Patent No.: US 12,096,140 B2
(45) Date of Patent: Sep. 17, 2024

(54) SELF CALIBRATING BARRIER MODULATION PIXEL

(71) Applicants: ams Sensors USA Inc., Plano, TX (US); ams Sensors Belgium BVBA, Berchem (BE)

(72) Inventors: Denver Lloyd, Boise, ID (US); Adi Xhakoni, Kessel Lo (BE); Scott Johnson, Boise, ID (US)

(73) Assignees: ams Sensors USA Inc., Plano, TX (US); ams Sensors Belgium BVBA, Berchem (BE)

( * ) Notice: Subject to any disclaimer, the term of this patent is extended or adjusted under 35 U.S.C. 154(b) by 172 days.

(21) Appl. No.: 17/818,962

(22) Filed: Aug. 10, 2022

(65) Prior Publication Data
US 2023/0051657 A1    Feb. 16, 2023

Related U.S. Application Data

(60) Provisional application No. 63/263,861, filed on Nov. 10, 2021.

(30) Foreign Application Priority Data

Aug. 10, 2021    (DE) .......................... 102021120779.7

(51) Int. Cl.
*H04N 25/59*    (2023.01)
*H01L 27/146*    (2006.01)
(Continued)

(52) U.S. Cl.
CPC ....... *H04N 25/59* (2023.01); *H01L 27/14612* (2013.01); *H01L 27/14643* (2013.01);
(Continued)

(58) Field of Classification Search
CPC .... H04N 25/59; H04N 25/531; H04N 25/583; H04N 25/585; H04N 25/62; H04N 25/75;
(Continued)

(56) References Cited

U.S. PATENT DOCUMENTS 10,250,832 B1    4/2019  Xu et al.
11,153,524 B1   10/2021  Yen et al.
(Continued)

FOREIGN PATENT DOCUMENTS

DE    102020004050 A1    1/2021
EP         1732315 A1   12/2006
(Continued)

OTHER PUBLICATIONS

Asatsuma, T. et al., "Sub-Pixel Architecture of CMOS Image Sensor Achieving over 120 dB Dynamic Range with Less Motion Artifact Characteristics," downloaded from https://www.imagesensors.org/Past%20Workshops/2019%20Workshop/2019%20Papers/R31.pdf on Oct. 17, 2022, 4 pages.

(Continued)

*Primary Examiner* — Kelly L Jerabek
(74) *Attorney, Agent, or Firm* — Slater Matsil, LLP

(57) ABSTRACT

In an embodiment a pixel arrangement includes a photodetector configured to accumulate charge carriers by converting electromagnetic radiation, a transfer transistor electrically coupled to the photodetector, a diffusion node electrically coupled to the transfer transistor, a reset transistor electrically coupled to the diffusion node and to a pixel supply voltage and a sample-and-hold stage including at least a first capacitor and a second capacitor, an input of the sample-and-hold stage being electrically coupled to the diffusion node via an amplifier, wherein the transfer transistor is configured to be pulsed to different voltage levels for transferring parts of the accumulated charge carriers to (Continued)

the diffusion node, wherein at least the second capacitor is configured to store a low conversion gain signal representing a first part of the accumulated charge carriers, and wherein the first capacitor is configured to store a high conversion gain signal representing a remaining part of the accumulated charge carriers.

20 Claims, 8 Drawing Sheets

(51) Int. Cl.
| | |
|---|---|
| *H04N 25/531* | (2023.01) |
| *H04N 25/583* | (2023.01) |
| *H04N 25/585* | (2023.01) |
| *H04N 25/62* | (2023.01) |
| *H04N 25/75* | (2023.01) |
| *H04N 25/778* | (2023.01) |

(52) U.S. Cl.
CPC ......... *H04N 25/531* (2023.01); *H04N 25/583* (2023.01); *H04N 25/585* (2023.01); *H04N 25/62* (2023.01); *H04N 25/75* (2023.01); *H04N 25/778* (2023.01)

(58) Field of Classification Search
CPC .. H04N 25/778; H04N 25/616; H04N 25/771; H04N 25/589; H04N 25/532; H01L 27/14612; H01L 27/14643
See application file for complete search history.

(56) References Cited

U.S. PATENT DOCUMENTS

| | | | |
|---|---|---|---|
| 11,218,653 | B2 | 1/2022 | Yang et al. |
| 2002/0190215 | A1 | 12/2002 | Tashiro et al. |
| 2004/0169753 | A1 | 9/2004 | Gulbransen et al. |
| 2009/0256060 | A1 | 10/2009 | Meynants et al. |
| 2011/0157441 | A1 | 6/2011 | Okita et al. |
| 2011/0221944 | A1 | 9/2011 | Deschamps |
| 2011/0242381 | A1 | 10/2011 | Sakakibara et al. |
| 2017/0324916 | A1 | 11/2017 | Sugawa et al. |
| 2019/0014276 | A1 | 1/2019 | Cheung et al. |
| 2019/0094394 | A1 | 3/2019 | Matsumoto |
| 2019/0273879 | A1 | 9/2019 | Xu et al. |
| 2020/0112697 | A1* | 4/2020 | Huang .............. H01L 27/14605 |
| 2020/0174122 | A1 | 6/2020 | Kimura |
| 2020/0244900 | A1 | 7/2020 | Hynecek |
| 2021/0014438 | A1 | 1/2021 | Yang et al. |
| 2021/0051283 | A1 | 2/2021 | Cowley et al. |
| 2021/0160448 | A1 | 5/2021 | Seo et al. |
| 2022/0191418 | A1* | 6/2022 | Jung ..................... H04N 25/75 |
| 2022/0321759 | A1 | 10/2022 | Miyauchi et al. |

FOREIGN PATENT DOCUMENTS

| | | | |
|---|---|---|---|
| EP | 2063632 | A | 5/2009 |
| EP | 1681850 | B1 | 3/2010 |
| EP | 1259066 | B1 | 9/2012 |
| EP | 2587794 | A2 | 5/2013 |
| EP | 2288142 | B1 | 1/2014 |
| WO | 2004074789 | A1 | 9/2004 |

OTHER PUBLICATIONS

Fowler, B., "High Dynamic Range Backside Illuminated Voltage Mode Global Shutter CIS for in Cabin Monitoring," Omni Vision, AutoSens Brussels 2021, Sep. 2021, 26 pages.

Miyauchi, K. et al., "A High Optical Performance 2.8μm BSI LOFIC Pixel with 120ke FWC and 160uV/e Conversion Gain," downloaded from https://www.semanticscholar.org/paper/A-High-Optical-Performance-2.8%CE%BCm-BSI-LOFIC-Pixel-Miyauchi Okura/659c2934936c6cb2e69edc5ca68480f7c84fa311 on Oct. 17, 2022, 4 pages.

Miyauchi, K., et al., "4.0 μm Stacked Voltage Mode Global Shutter Pixels with a BSI LOFIC and A PDAF Capbility," IITE Trans. on MTA vol. 10, No. 4, Oct. 1, 2022, 4 pages.

Mori, K. et al., "Back Side Illuminated High Dynamic Range 4.0μm Voltage Domain Global Shutter Pixel with Multiple Gain Readout," downloaded from https://www.semanticscholar.org/paper/Back-Side-Illuminated-High-Dynamic-Range-4.0μm-Toshiyuki-Kazuya/e312cc181b451122d7200227eb756b04548c9b09 on Oct. 17, 2022, Semantic Scholar, 4 pages.

Oh, M. et al., "3.0μm Backside Illuminated, Lateral Overflow, High Dynamic Range, LED Flicker Mitigation Image Sensor," downloaded from https:www.imagesensors.org on Oct. 17, 2022, 4 pages.

Solhusvik, J. et al., "A 1280×960 2.8μm HDR CIS with DCG and Split-Pixel Combined," downloaded from https://www.imagesensors.org on Oct. 17, 2022, 4 pages.

Xu, C. et al., "A Stacked Global-Shutter CMOS Imager with SC-Type Hybrid-GS Pixel and Self-Knee Point Calibration Single Frame HDR and On-Chip Binarization Algorithm for Smart Vision Applications," 2019 IEEE International Solid-State Circuits Conference, Feb. 18, 2019, 3 pages.

Chen Xu et al., "A Stacked Global-Shutter CMOS Imager with SC-Type Hybrid-GS Pixel and Self-Knee Point Calibration Single-Frame HDR and On-Chip Binarization Algorithm for Smart Vision Applications", IEEE International Solid-State Circuits Conference, SESSION 5, Image Sensors, 5.1, 94-96, Feb. 18, 2019, Total pp. 03.

Guy Meynants et al., "Backside illuminated global shutter CMOS image sensors", Engineering, Physics, Jun. 8, 2011, Total pp. 04.

* cited by examiner

SELF CALIBRATING BARRIER MODULATION PIXEL

CROSS-REFERENCE TO RELATED APPLICATIONS

This application claims the benefit of U.S. Provisional Application No. 63/263,861, filed on Nov. 10, 2021, and German Application No. 102021120779.7, filed Aug. 10, 2021, which applications are hereby incorporated herein by reference.

TECHNICAL FIELD

The present invention relates to a pixel arrangement, an image sensor and method for operating a pixel arrangement.

BACKGROUND

CMOS image sensors are used in a wide range of applications, such as for camera modules and smartphones, tablet computers, laptops etc. For some applications a high dynamic range (HDR), for example above 85 dB, is required. The dynamic range (DR) is limited on the one side by the noise floor at low light conditions, and by saturation effects at high light conditions on the other side. Further, a size of the pixels comprised by such image sensors has to be kept small.

SUMMARY

Embodiments provide a pixel arrangement with a high dynamic range and a method for operating such pixel arrangement. Further embodiments provide an image sensor comprising a pixel arrangement with high dynamic range.

Here and in the following, the terms "pixel" and "pixel arrangement" refer to a light receiving element, which might be arranged in a two-dimensional array, also called matrix, with other pixels. Pixels in the array are arranged in rows and columns. The terms "row" and "column" can be used interchangeably, since they depend only on the orientation of the pixel array. The pixel might also include circuitry for controlling signals to and from the pixel. Thus, the pixel may form a so-called active pixel. The pixel may receive light in an arbitrary wavelength range. The term "light" may refer to electromagnetic radiation in general, including infrared (IR) radiation, ultraviolet (UV) radiation and visible (VIS) light, for example.

In an embodiment, a pixel arrangement comprises a photodetector configured to accumulate charge carriers by converting electromagnetic radiation. The pixel arrangement may form a global shutter pixel, in particular a voltage domain global shutter pixel, abbreviated VGS pixel. It is also possible that the pixel forms a rolling shutter pixel. The photodetector may in particular be a photodiode or a pinned photodiode. The photodiode may be arranged in a substrate, in particular a semiconductor substrate.

In an embodiment, the pixel arrangement comprises a transfer transistor electrically coupled to the photodetector. In an embodiment, the pixel arrangement comprises a diffusion node electrically coupled to the transfer transistor. The transfer transistor forms a switch. A first terminal of the transfer transistor is connected to the photodetector and a second terminal of the transfer transistor is connected to the diffusion node. By applying a transfer signal to the gate of the transfer transistor charge carriers can diffuse from the photodetector towards the diffusion node. The diffusion node may be a floating diffusion node, abbreviated FD node. The FD node may comprise a capacitance for temporarily storing charge carriers. In the following, the terms FD node and diffusion node are used synonymously.

In an embodiment, the pixel arrangement comprises a reset transistor electrically coupled to the diffusion node and to a pixel supply voltage. The reset transistor is provided for resetting the FD node. The reset transistor forms a switch. A first terminal of the reset transistor is connected to a pixel supply voltage and a second terminal is coupled to the FD node. By applying a reset signal to the gate of the reset transistor any redundant charge carriers are drained to the pixel supply.

In an embodiment, the pixel arrangement comprises a sample-and-hold stage comprising at least a first capacitor and a second capacitor. An input of the sample-and-hold stage is electrically coupled to the diffusion node via an amplifier. The sample-and-hold stage may be abbreviated S/H stage. The first and the second capacitors may be called S/H capacitors. The amplifier may be comprised by the S/H stage. The amplifier may be formed as common-drain amplifier, also known as source follower. A gate terminal of the source follower is connected to the FD node and serves as input terminal of the amplifier. A common terminal may be connected to the supply voltage. An amplified signal is generated at an output terminal of the amplifier based on the charge signal at the FD node. The amplifier may be used as voltage buffer. The amplifier may be configured to buffer the signal, thus to decouple the FD node from further pixel components. The capacitors are electrically coupled to the output terminal of the amplifier via switching transistors. The capacitors may have the same or similar capacitance.

In an embodiment, the transfer transistor is configured to be pulsed to different voltage levels for transferring parts of the accumulated charge carriers to the diffusion node. The different voltage levels can be partial voltage levels. Thus, a potential barrier between the photodetector and the diffusion node can be modified or modulated. Thus, the pixel arrangement can be used for barrier modulation. Depending on the barrier, fractions of the accumulated charge carriers can overcome the barrier and can be transferred to the diffusion node.

In an embodiment, at least the second capacitor is configured to store a low conversion gain signal representing a first part of the accumulated charge carriers. The low conversion gain signal may be referred to as LCG signal. The LCG signal may be stored on the second capacitor or redistributed on both the first and the second capacitor. The LCG signal refers to a signal generated with low gain. This can mean that the signal is based on only part of the accumulated charge carriers, in particular the first part. This can also mean that the LCG signal is additionally attenuated.

In an embodiment, the first capacitor is configured to store a high conversion gain signal representing a remaining part of the accumulated charge carriers. The high conversion gain signal may be referred to as HCG signal. The HCG signal is stored on the first capacitor. The HCG signal refers to a signal generated with high gain. This can mean that the signal is based on a remaining part of the accumulated charge carriers, which may be a main part. This can also mean that the HCG signal is additionally amplified.

The pixel arrangement barrier utilizes barrier modulation of the transfer gate. By means of barrier modulation, the dynamic range of the pixel arrangement can be increased. Further, only two capacitors are needed to realize this function of the pixel arrangement. This allows the pixel arrangement to have low area.

In an embodiment, a pixel arrangement comprises a photodetector configured to accumulate charge carriers by converting electromagnetic radiation, a transfer transistor electrically coupled to the photodetector, a diffusion node electrically coupled to the transfer transistor, a reset transistor electrically coupled to the diffusion node and to a pixel supply voltage, a sample-and-hold stage comprising at least a first capacitor and a second capacitor, an input of the sample-and-hold stage being electrically coupled to the diffusion node via an amplifier, wherein the transfer transistor is configured to be pulsed to different voltage levels for transferring parts of the accumulated charge carriers to the diffusion node, at least the second capacitor is configured to store a low conversion gain signal representing a first part of the accumulated charge carriers, and wherein the first capacitor is configured to store a high conversion gain signal representing a remaining part of the accumulated charge carriers.

In an embodiment, the low conversion gain signal and the high conversion gain signal comprise a common noise level. The common noise level may consist in particular of thermal noise and reset noise. Thus, the LCG signal can be used as reference level for the HCG signal. This means that the HCG can be accessed with correlated double sampling, CDS. Since the HCG signal is used at low light conditions, thermal noise is a relevant parameter. In this case, the LCG signal may comprise just noise without any video information. The HCG signal may equal the LCG signal plus an additional video signal, wherein the additional video signal may represent a pure video signal without noise. Thus, the noise of the HCG signal is correlated with the noise of the LCG signal. The thermal and reset noise can effectively suppressed by CDS. Performing CDS can mean that the LCG signal is subtracted from the HCG signal. In high light conditions, the LCG is further processed. Here, thermal noise is less relevant, since photon shot noise dominates at high illumination levels. Here, double delta sampling, DDS, is sufficient. It may be determined based on respective amplitude levels, whether to use the LCG signal or the HCG signal for further processing.

In an embodiment, the high conversion gain signal indicates a calibration level for adjusting a pixel output signal in dependence of a pixel specific knee point value. Thus, it is possible to adjust a pixel output signal based on the LCG signal and the HCG signal in dependence of the pixel specific knee point value that is determined based on the calibration level. Knowing the voltage levels for barrier modulation and the HCG signal, information about the barrier can be deduced. Thus, the HCG signal can be used as calibration level for the LCG signal. This can mean that the calibration level is equal to the HCG signal.

In an embodiment, the pixel arrangement further comprises a dual conversion gain transistor and a dual conversion gain capacitor. The dual conversion gain transistor connects the diffusion node to a terminal node of the dual conversion gain capacitor, and the reset transistor is electrically coupled to the diffusion node via said terminal node and the dual conversion gain transistor. Dual conversion gain may be abbreviated DCG. The DCG capacitor may also be named third capacitor in the following. The DCG transistor may be named coupling transistor in the following. By means of the DCG transistor and the DCG capacitor a conversion gain of the LCG signal and of the HCG signal may be adjusted.

In an embodiment, the pixel arrangement further comprises at least two switching transistors, wherein each switching transistor is assigned to a respective capacitor of the sample-and-hold stage and couples a terminal node of the respective capacitor to the input of the sample-and-hold stage. By applying a respective switch signal the LCG signal and the HCG signal can be transferred to the respective capacitor and stored thereon.

In an embodiment, the first and the second capacitor of the sample-and-hold stage are arranged in parallel. In this embodiment, the capacitors can be controlled independently by means of the assigned switching transistors.

In an embodiment, the at least two capacitors of the sample-and-hold stage are arranged cascaded. In this embodiment, a first switching transistor couples the output terminal of the amplifier to a terminal node of the first capacitor. A second switching transistor couples the terminal node of the first capacitor to a terminal node of the second capacitors. Fewer circuit components are needed than in the case of the parallel arrangement.

In an embodiment, the sample-and-hold stage comprises exactly two capacitors.

In an embodiment, the sample-and-hold stage further comprises a predetermined number of additional capacitors, each of the additional capacitors being configured to store an additional signal representing a further part of the accumulated charge carriers. Further, each of the additional signals may indicate an additional calibration level for adjusting the pixel output signal.

In an embodiment, the pixel arrangement comprises a further amplifier coupled to an output of the sample-and-hold stage, and a select transistor, the select transistor electrically connecting the further amplifier to a column bus.

Furthermore, an image sensor is provided that comprises the pixel arrangement as described in one of the above embodiments. In particular, the image sensor may comprise an array of pixel arrangements. This means that all features disclosed for the pixel arrangement are also disclosed for and applicable to the image sensor and vice-versa.

The image sensor can be conveniently employed in optoelectronic devices, such as smart phones, tablet computers, laptops, or camera modules. For example, the camera module is configured to operate in the visible domain for photography and/or video capturing. Further, the pixel arrangement is in particular suited to be operated in global shutter mode, as the signals are stored in a pixel level memory, i.e. the first capacitor and the second capacitor. The global shutter mode is in particular suited for infrared applications, where the image sensor device further comprises a light source that is synchronized with the pixels. Thus, an optoelectronic device comprising such image sensor may also work in the infrared (IR) domain, for example for 3D imaging and/or identification purposes. Image sensors with infrared sensitivity can be used in dark environments where video feed is required. Such applications reach from mobile phone face unlock to driver monitoring systems. Both can deploy illuminators that are in the short-wave infrared (SWIR) spectrum, so that the phone user/driver is not blinded by the light that is illuminating him/her.

Furthermore, a method for operating a pixel arrangement is provided. The pixel arrangement described above can preferably be employed for the method for operating the pixel arrangement described herein. This can mean that the pixel arrangement can be configured to be operated according to the following method. All features disclosed for the pixel arrangement and the image sensor are also disclosed for the method for operating the pixel arrangement and vice-versa.

In an embodiment of the method, the method comprises, during an exposure period, accumulating, in a first integration period, charge carriers with a photodetector comprised by the pixel arrangement. The method further comprises, during the exposure period, pulsing, at an end of the first integration period, a transfer transistor to a first voltage level to transfer a portion of the accumulated charge carriers to a diffusion node, wherein said portion is configured to be drained to a supply voltage. The first integration period is part of the exposure period. This can mean, that the exposure period is subdivided into several integration periods, for example a first integration period and a second integration period. The first voltage level may be a voltage level below a threshold voltage of the transfer transistor. This can mean that the first voltage level is a partial voltage level. By applying the first voltage level to the transfer transistor, a potential barrier between the photodetector and the diffusion node is lowered. Thus, excess charge carriers may overcome the lowered potential barrier to be transferred from the photodetector to the diffusion node. These excess charge carriers are referred to as said portion of the accumulated charge carriers. Said portion is configured to be drained to the supply voltage. This can mean that after the said portion is transferred to the diffusion node, the diffusion node is reset. Resetting the diffusion node can be realized, as mentioned above, by applying a reset signal to a reset transistor that is connected between the diffusion node and a pixel supply terminal. Draining of said portion may be conducted at the end of the exposure period or after the exposure period, for example at beginning of a storage period or in a dedicated draining period.

In an embodiment, the method further comprises, during the exposure period, continuing to accumulate, in a second integration period, charge carriers with the photodetector. The second integration period is part of the exposure period. The second integration period is later than the first integration period. The second integration period may immediately follow the first integration period. The exposure period may comprise or consist of the first and the second integration periods. The exposure period may comprise more integration periods. The charge carriers accumulated at the photodiode after the second integration period may comprise the charge carriers accumulated during the first and the second integration periods minus the portion of charge carriers to be drained.

In an embodiment, the method further comprises, during a storage period, pulsing the transfer transistor to the first voltage level for transferring a first part of the accumulated charge carriers to the diffusion node and storing a low conversion gain signal representing the first part of the accumulated charge carriers on at least a second capacitor coupled to the diffusion node. The storage period may immediately follow the exposure period. Transferring the first part of accumulated charge carriers may be conducted after resetting the diffusion node for draining the portion of accumulated charge carriers. The first part of accumulated charge carriers is different from the portion of accumulated charge carriers. However, since the first voltage level is again applied to the transfer gate, the potential barrier is lowered by the same amount. Thus, the first part of accumulated charge carriers corresponds to excess charge carriers accumulated during the second integration period. The first part of accumulated charge carriers is not drained but stored. In case that two capacitors are arranged cascaded, as mentioned above, the LCG signal representing the first part of the accumulated charge carriers may be distributed on both capacitors. In case that the capacitors are arranged in parallel, the LCG signal may be stored on the second capacitor. Storing the LCG signal may be realized by applying switch signals to respective switches (switching transistors) assigned to the capacitors.

In an embodiment, the method further comprises, during the storage period, pulsing the transfer transistor to a full voltage level for transferring a remaining part of the accumulated charge carriers to the diffusion node and storing a high conversion gain signal representing the remaining part of the accumulated charge carriers on a first capacitor coupled to the diffusion node. Pulsing the transfer transistor to the full voltage level is conducted later than pulsing the transfer transistor to the first voltage level. The full voltage level may be a voltage level above the threshold voltage level of the transfer transistor. Thus, by applying the full voltage level the transfer transistor is in an electrically conductive state. Thus, by applying the full voltage level the potential barrier between the photodetector and the diffusion node is lower than the potential barrier when the first voltage level is applied. In particular, the potential barrier may be completely dissipated. Thus, the remaining charge carriers accumulated at the photodetector are transferred to the diffusion node.

In an embodiment, the method further comprises, during a readout period, reading out the low conversion gain signal and the high conversion gain signal stored on the capacitors. The readout period may immediately follow the storage period. Reading out the respective signals may be conducted by applying a select signal to a select transistor, as mentioned above. The select signal connects the capacitors with the signals stored on them to a column bus of the pixel. The capacitors may be electrically coupled to the column bus via a further amplifier, as explained above. The further amplifier may be implemented as further source follower.

The described method comprises barrier modulation of the transfer transistor. By means of barrier modulation, the dynamic range of the pixel arrangement can be increased. In particular, the dynamic range of the pixel arrangement is increased by draining a portion of the accumulated charge carriers at high light conditions. The HCG signal contains a knee point calibration value needed during linearization of the pixel output signal. In particular, knowing the duration of the first integration period and the second integration period, respectively, and the first voltage level, it is possible to reconstruct a linearized signal. The transfer transistor of each pixel is subject of variations and fluctuations in the manufacturing process. Thus, the threshold voltage of the transfer transistor differs for each pixel. This can mean that the barrier between the photodetector and the diffusion node differs for each pixel when applying the first voltage level. However, knowing the exact barrier level is relevant to remove fixed pattern noise, FPN. From the first voltage level and the HCG signal of the pixel (which corresponds to the remaining part of the accumulated charge carriers after applying the first voltage level), information about the dependence of an output signal on the barrier can be derived. Moreover, since the first voltage level that is applied during the exposure period is also applied during the storage period, the ratio of the first and second integration periods and the HCG signal can be used to determine how large the amount of charge carriers was that was drained to the supply voltage at the end of the first integration period. Given this amount and the LCG signal, a pixel output signal can be reconstructed that is used at high light conditions.

Further, the LCG signal may serve as reference level for the HCG signal, since both signals are based on a common noise level, since the diffusion node is not reset between storing the LCG and the HCG signal. Thus, CDS can be performed for the HCG signal that is used at low light conditions (at low light conditions, the LCG signal only contains noise, but no video information).

In an embodiment, the method comprises: during an exposure period, accumulating, in a first integration period, charge carriers with a photodetector comprised by the pixel arrangement, pulsing, at an end of the first integration period, a transfer transistor to a first voltage level to transfer a portion of the accumulated charge carriers to a diffusion node, wherein said portion is configured to be drained to a supply voltage, continuing to accumulate, in a second integration period, charge carriers with the photodetector. The method further comprises: during a storage period, pulsing the transfer transistor to the first voltage level for transferring a first part of the accumulated charge carriers to the diffusion node, storing a low conversion gain signal representing the first part of the accumulated charge carriers on at least a second capacitor coupled to the diffusion node, pulsing the transfer transistor to a full voltage level for transferring a remaining part of the accumulated charge carriers to the diffusion node, storing a high conversion gain signal representing the remaining part of the accumulated charge carriers on a first capacitor coupled to the diffusion node. The method further comprises: during a readout period, reading out the low conversion gain signal and the high conversion gain signal stored on the capacitors.

In an embodiment, the method further comprises, during the exposure period and after the second integration period, at least one additional pulsing the transfer transistor to a respective further voltage level, wherein with each additional pulsing an additional portion of the accumulated charge carriers is configured to be drained to the pixel supply voltage. Each additional pulsing is followed by an additional continuing to accumulate, in a respective additional integration period, charge carriers with the photodetector. In an example, the further voltage level is a second voltage level or a third voltage level, respectively. In an example, the additional integration period is a third integration period or a fourth integration period, respectively. The third integration period may follow the pulse to the second voltage level. The fourth integration period may follow the pulse to the third voltage level and so on. In other words, during the exposure period, the transfer transistor may be pulsed to some partial voltage levels n number of times and charge is drained through to supply. Draining the portions of accumulated charge carriers to supply may be conducted after the exposure period. Thus, dynamic range may further be extended because n additional barrier levels can be utilized.

In an embodiment, voltage levels at which successive pulses during the exposure period are applied are equal or decrease from pulse to pulse. In an example, the first voltage level is larger than or equal to the second voltage level. In an example, the second voltage level is larger than or equal to the third voltage level and so on.

In an embodiment, integration periods following the pulsing during the exposure period decrease from integration period to integration period. This means that the time intervals of said integration periods decrease. In an example, the first integration period is longer than the second integration period. In an example, the second integration period is longer than the third integration period, which may be longer than the fourth integration period and so on. In this way, the amount of accumulated charge carriers decrease from integration period to integration period. Thus, information about drained portions of accumulated charge carriers is not lost, but can be reconstructed based on the knowledge of voltage levels and integration periods. Thus, it is possible to reconstruct a linearized pixel output signal.

In an embodiment, the high conversion gain signal indicates a calibration level based on the remaining part of the accumulated charge carriers. The HCG signal contains the calibration level, since the first voltage level that is applied during the exposure period is also applied during the storage period.

In an embodiment, the method further comprises adjusting a pixel output signal based on the low conversion gain signal and/or the high conversion gain signal in dependence of a pixel specific knee point value that is determined based on the calibration level. Given the first voltage level and the HCG signal, information about the barrier can be derived. Thus, the HCG signal can be used as calibration level for the LCG signal. This can mean that the calibration level is equal to the HCG signal. In other words, the information about the drained portion of accumulated charge carriers is not lost, but can be reconstructed based on the first voltage level and the HCG signal and the integration periods. Further, the calibration level is needed in post processing to remove FPN caused by variations in the transfer transistor. The calibration level can also be used as a reference to remove FPN variation caused by the additional n−1 pulses that occurred during integration.

In an embodiment, reading the low conversion gain signal comprises double delta sampling, DDS. DDS can be performed by using a reset level as a reference level for the LCG signal. The reset level may be read out in a step during the readout period, for example after the HCG and the LCG signal are read out. Resetting the FD node is performed by applying a reset signal to the reset transistor. The reset level refers to a non-video signal of the pixel arrangement, i.e. without a video signal from the photodetector. By resetting the FD node additional noise is introduced that is not correlated with the noise of the HCG and the LCG signal. However, the reset level of the pixel arrangement comprises information about fixed pattern noise, FPN.

In an embodiment, reading the high conversion gain signal comprises correlated double sampling. As mentioned above, the LCG signal can be used as reference level for the HCG signal to perform CDS, since both signals are based on a common noise level. Thus, the LCG signal can be subtracted from the HCG signal.

In an embodiment, the diffusion node is not reset between transferring the first part of the accumulated charge carriers and the remaining part of the accumulated charge carriers, such that the high conversion gain signal and the low conversion gain signal are based on a common noise level.

In an embodiment, the method further comprises, during the storage period, pulsing the transfer transistor to the respective further voltage level for transferring a further part of the accumulated charge carriers to the diffusion node, and storing a further signal representing the further part of the accumulated charge carriers on a further capacitor coupled to the diffusion node. This can mean that the S/H stage may comprise further capacitors that are arranged cascaded or in parallel to the first capacitor and the second capacitor. The further voltage level may the respective voltage level applied during the exposure period. That is, the further voltage level may be the second voltage level, the third voltage level etc. Pulsing the transfer transistor to the respective further voltage level may be prior to pulsing the transfer transistor to the first voltage level during the storage period. The order with which corresponding voltage levels are applied during the storage period can be the reverse of the order in which the corresponding pulses are applied in the exposure period. Thus, the corresponding further part of the accumulated charge carriers gives information about the portion of charge carriers that was drained during the exposure period at the corresponding pulse to the respective voltage level, and thus can serve as further calibration level.

In an embodiment, the further signal indicates a further calibration level based on the further part of the accumulated charge carriers, and adjusting the pixel output signal is conducted in dependence of a further pixel specific knee point value that is determined based on the further calibration level.

In an embodiment, the method further comprises, during the readout period, reading out the further signal stored on the further capacitor, wherein reading the further signal comprises correlated double sampling. This can mean that the further signal(s), the LCG signal and the HCG signal are based on a common noise level.

Furthermore, another method for operating the pixel arrangement is provided. The pixel arrangement described above can also be used for this method of operating. This means that all features disclosed for the pixel arrangement and the image sensor are also disclosed for the following method of operating the pixel arrangement and vice-versa. Further, aspects of the above discussed method are also relevant for the following method. Thus, embodiments of the above method are also disclosed for and applicable to the following method.

In an embodiment, the method of operating the pixel arrangement comprises accumulating, during an exposure period, charge carriers with a photodetector comprised by the pixel arrangement. The method further comprises performing the following steps during the accumulation: first pulsing a transfer transistor to a first voltage level to transfer a portion of the accumulated charge carriers to a diffusion node, wherein said portion is configured to be drained to a supply voltage; second pulsing the transfer transistor to the first voltage level for transferring a first part of the accumulated charge carriers to the diffusion node, and storing a low conversion gain signal representing the first part of the accumulated charge carriers on at least a second capacitor coupled to the diffusion node. At an end of the exposure period, the method further comprises pulsing the transfer transistor to a full voltage level for transferring a remaining part of the accumulated charge carriers to the diffusion node. After said pulsing to the full voltage level, the method further comprises storing a high conversion gain signal representing the remaining part of the accumulated charge carriers on a first capacitor coupled to the diffusion node.

In an embodiment, the method further comprises, during a readout period, reading out the low conversion gain signal and the high conversion gain signal stored on the capacitors.

The first voltage level may be smaller than the full voltage level. The full voltage level may be, for example, 2.8 V. The first voltage level may be, for example, 0.8 V. Storing the high conversion gain signal and the low conversion gain signal on the capacitors may be conducted during a storage period. Thus, the storage period may overlap with the exposure period. The period from the first pulse to the first voltage level to the second pulse to the first voltage level may be referred to as first integration period. Draining the portion of accumulated charge carriers is achieved by applying a reset signal to a reset transistor, as explained above.

Advantageously, the method of operating the pixel arrangement uses barrier modulation of the transfer transistor to in increase the dynamic range of the pixel arrangement. Advantageously, only two storage capacitors are required, i.e. the first and the second capacitor, wherein one of the capacitors stores the LCG signal representing the first part of accumulated charge carriers and the other one of the capacitors stores the HCG signal representing the remaining part of accumulated charge carriers. Advantageously, a pixel output signal can be reconstructed based on the LCG signal and the HCG signal. The HCG signal may indicate a calibration level for barrier modulation, in particular at high light conditions. The LCG signal may indicate a reference level for correlated double sampling, in particular at low light conditions.

In an embodiment, the first part of accumulated charge carriers is stored by applying a low conversion gain. This can mean that the LCG signal is sampled/stored with a low conversion gain. This may be achieved by activating a coupling signal to a coupling transistor. The coupling transistor may be named dual conversion gain transistor. In an embodiment, the remaining part of accumulated charge carriers is stored by applying a high conversion gain. This can mean that the HCG signal is sampled/stored with a high conversion gain. This may be achieved by deactivating the coupling signal. By applying the coupling signal to the dual conversion gain transistor, the diffusion node is electrically connected to a dual conversion gain capacitor, which may be named third capacitor. Thus, the diffusion node and the dual conversion gain capacitor can be shorted. By shorting the diffusion node and the dual conversion gain capacitor a total capacitance is increased. Keeping the charge constant, this leads to a reduced voltage signal. Thus, the voltage on the diffusion node can be compressed. Thus, by enlarging the capacitance the gain is reduced. This means that the pixel arrangement has a reduced gain, if the diffusion node and the third capacitor are shorted. In other words, the pixel arrangement has an increased gain, if the third capacitor is electrically decoupled from the diffusion node. Thus, two different conversion gains can be provided. Using dual gain allows for more dynamic range of the pixel arrangement. Advantageously, dual gain can be combined with barrier modulation allowing for even more dynamic range. Advantageously, only two storage capacitors are required, i.e. the first and the second capacitor. Thus, in dual conversion gain mode, both gains are stored on pixel-level capacitors and are available for reconstruction at column level.

The first and the second capacitor may be arranged in parallel or cascaded. Before the exposure period there may be a reset period for removing any redundant charge carriers from the photodiode and the diffusion node.

In an embodiment, the method further comprises, after the first pulsing to the first voltage level and before the second pulsing to the first voltage level, at least one additional pulsing the transfer transistor to a respective further voltage level for transferring a respective further portion of the accumulated charge carriers to the diffusion node, wherein said further portion is configured to be drained to the supply voltage.

In an example, the method comprises pulsing the transfer transistor to a second voltage level for transferring a further portion of the accumulated charge carriers to the diffusion node, wherein said further portion is configured to be drained to the supply voltage. The second voltage level may be smaller than the first voltage level. The second voltage level may be, for example, 0.4 V. The period from the pulse to the second voltage level to the second pulse to the first voltage level may be referred to as second integration period. Thus, the second integration period is smaller than the first integration period and overlaps with the first integration period.

In an embodiment, voltage levels at which successive pulses are applied until the second pulsing to the first voltage level are equal or decrease from pulse to pulse. In an embodiment, the high conversion gain signal indicates a calibration level based on the remaining part of the accumulated charge carriers. In an embodiment, the method further comprises adjusting a pixel output signal based on the low conversion gain signal and/or the high conversion gain signal in dependence of a pixel specific knee point value that is determined based on the calibration level. In an embodiment, reading the low conversion gain signal is a double delta sampling read. In an embodiment, reading the high conversion gain signal is a correlated double sampling read.

Further embodiments of the methods become apparent to the skilled reader from the embodiments of the pixel arrangement and the method of operating the pixel arrangement described above, and vice-versa. The pixel arrangement may form a voltage domain global shutter pixel. Alternatively, the pixel arrangement forms a rolling shutter pixel. The disclosed method achieves HDR without impacting the pipeline mode of the pixel (pipelining the respective signals to the S/H capacitors). The dynamic range can be further extended by using multiple barriers. The pixel arrangement can have low area by utilizing only two S/H capacitors. Further, the low light performance can be improved by utilizing dual conversion gain components. The method utilizes self-calibrating barrier modulation, such that no additional read is needed. This is possible, since the HCG signal contains a calibration level as a reference level to calibrate additional barriers. The disclosure applies to any system where one of the reads is used as the knee point calibration and additional knee points are used and calibrated using the first knee point as a reference level.

Further, a method for operating an imaging device is provided, the imaging device comprising a pixel arrangement as described above. This means that all features disclosed for the pixel arrangement and the image sensor are also disclosed for the method of operating the imaging device and vice-versa.

In an embodiment, the method of operating an imaging device, comprises: during an exposure period: accumulating, in a first integration period, charge carriers with a photodetector of a pixel comprised by the imaging device, first pulsing, at an end of the first integration period, a transfer transistor to a first voltage level, the transfer transistor being electrically coupled to the photodetector, continuing to accumulate, in a second integration period, charge carriers with the photodetector, second pulsing, at an end of the second integration period, the transfer transistor to a second voltage level, continuing to accumulate, in a third integration period, charge carriers with the photodetector, and during a storage period: resetting a diffusion node which is electrically coupled to the transfer transistor and a gain conversion node which is electrically coupled to the diffusion node, third pulsing the transfer transistor to the first voltage level for transferring a first part of the accumulated charge carriers to the diffusion node and the gain conversion node, storing a low conversion gain signal representing the first part of the accumulated charge carriers on a pair of capacitors electrically coupled to the diffusion node, fourth pulsing the transfer transistor to a threshold voltage level for transferring a remaining part of the accumulated charge carriers to the diffusion node, storing a high conversion gain signal representing the remaining part of the accumulated charge carriers on a first capacitor of the pair of capacitors, and during a readout period: reading out the low conversion gain signal and the high conversion gain signal stored on the pair of capacitors.

In an embodiment, the method further comprises: during the exposure period: at least one further pulsing, after the third integration period, the transfer transistor to a respective further voltage level, wherein each further pulsing is followed by further continuing to accumulate, in a respective further integration period, charge carriers with the photodetector.

In an embodiment, with each pulsing during the exposure period a portion of the accumulated charge carriers is drained to a pixel supply voltage.

In an embodiment, the first voltage level is larger than the second voltage level.

In an embodiment, reading out the low conversion gain signal comprises double delta sampling, and wherein reading out the high conversion gain signal comprises correlated double sampling.

In an embodiment, the diffusion node is not reset between transferring the first part of the accumulated charge carriers and the remaining part of the accumulated charge carriers, such that the high conversion gain signal and the low conversion gain signal are based on a common noise level.

In an embodiment, the high conversion gain signal indicates a calibration level based on the remaining part of the accumulated charge carriers.

In an embodiment, the method further comprising adjusting a pixel output signal based on the read out low conversion gain signal and high conversion gain signal in dependence of a pixel specific knee point value that is determined based on the calibration level.

Further, an imaging device is provided, the imaging device comprising the pixel arrangement as described above. This means that all features disclosed for the pixel arrangement and the image sensor are also disclosed for the imaging device and vice-versa.

In an embodiment, the imaging device comprising a plurality of pixels, each pixel comprising: a photodetector configured to accumulate charge carriers by converting electromagnetic radiation, a transfer transistor electrically coupled to the photodetector, a diffusion node electrically coupled to the transfer transistor, a gain conversion node electrically coupled to the diffusion node via a gain switch, a reset switch electrically coupled to the diffusion node via the gain switch, a sample-and-hold stage comprising a pair of capacitors, an input of the sample-and-hold stage being electrically coupled to the diffusion node via an amplifier, wherein the transfer transistor is configured to be pulsed to different voltage levels, the pair of capacitors is configured to store a low conversion gain signal representing a first part of the accumulated charge carriers, and wherein a first capacitor of the pair of capacitors is further configured to store a high conversion gain signal representing the remaining part of the accumulated charge carriers.

In an embodiment, the imaging device further comprises a dual gain capacitor electrically coupled to the gain conversion node.

In an embodiment, the pair of capacitors comprises a first capacitor and a second capacitor, wherein a first end of the first capacitor is electrically coupled to the amplifier via a first switch, a first end of the second capacitor is electrically coupled the first end of the first capacitor via a second switch and forming an output of the sample-and-hold stage, and second ends of both capacitors are electrically connected to a constant voltage node.

In an embodiment, the imaging device further comprises a select switch electrically connecting the output of the sample-and-hold stage via a further amplifier to a column bus.

BRIEF DESCRIPTION OF THE DRAWINGS

The following description of figures may further illustrate and explain aspects of the pixel arrangement and the method of operating the pixel arrangement. Components and parts of the pixel arrangement that are functionally identical or have an identical effect are denoted by identical reference symbols. Identical or effectively identical components and parts might be described only with respect to the figures where they occur first. Their description is not necessarily repeated in successive figures.

DETAILED DESCRIPTION OF ILLUSTRATIVE EMBODIMENTS

Figure 1:
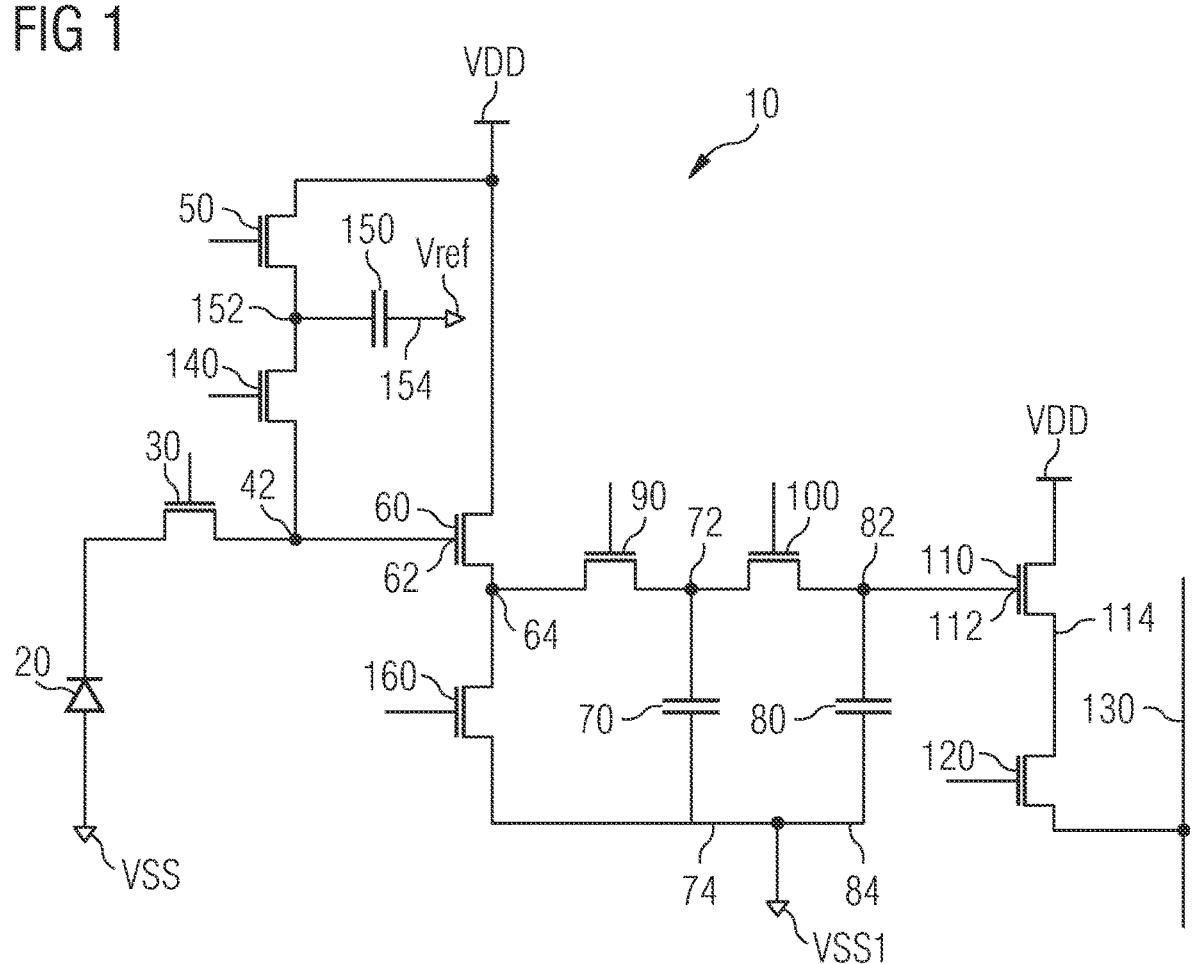
FIG. 1 shows an exemplary embodiment of a pixel arrangement.

In FIG. 1 an exemplary embodiment of a pixel arrangement 10 comprised by an image sensor 200 is shown. The shown pixel arrangement 10 can be operated to achieve high dynamic range (HDR). The pixel arrangement 10 is configured to convert electromagnetic radiation into a high conversion gain (HCG) signal and into low conversion gain (LCG) signal.

The pixel arrangement 10 comprises a photodiode 20 configured to convert electromagnetic radiation into charge carriers. The photodiode 20 may also be referred to as photodetector 20. The photodiode 20 comprises an anode terminal and a cathode terminal. An anode terminal of the photodiode 20 is connected to a negative pixel supply voltage VSS, which can also be ground (GND). The photodiode 20 may convert light of any wavelength, for example visible light, infrared light and/or ultraviolet light.

The pixel further comprises a transfer transistor 30 between the photodiode 20 and a diffusion node 42. The transfer transistor 30 acts as a switch. The transfer transistor 30 is configured to be pulsed to different voltage levels for transferring parts of the accumulated charge carriers to the diffusion node 42. A first terminal of the transfer transistor 30 is electrically connected to the cathode terminal of the photodiode 20. A second terminal of the transfer transistor 30 is electrically connected to the diffusion node 42. The diffusion node 42 may be named floating diffusion (FD) node in the following. The FD node 42 may have or may be connected to a capacitance 40 (shown in FIG. 8). The capacitance may be implemented as capacitor (not shown) and may be called FD capacitance. Alternatively, the capacitance may be formed by parasitic capacitances. The transfer transistor 30 is configured to receive a transfer signal TX for transferring charge carriers from the photodiode 20 to the FD node 42. The FD node 42, in particular the FD capacitance, is configured to buffer or temporarily store charge carriers from the photodiode 20. The FD capacitance may be configured to transform the charge carriers into a voltage signal.

The pixel arrangement 10 further comprises a reset transistor 50 electrically coupled to the FD node 42 for resetting the FD node 42. The reset transistor 50 acts as a switch. A first terminal of the reset transistor 50 is electrically connected to a pixel supply voltage VDD. A second terminal of the reset transistor 50 is electrically connected to the FD node via a coupling transistor 140. The coupling transistor 140 may be named dual conversion gain (DCG) transistor 140. The reset transistor 30 is configured to receive a reset signal RST for resetting the FD node 42 by applying the pixel supply voltage VDD and therefore draining any redundant charge carriers.

The pixel arrangement 10 further comprises an amplifier 60, which is electrically connected to the FD node 42. The amplifier 60 is configured to generate the low conversion gain (LCG) signal and the high conversion gain (HCG) signal, respectively, depending on the capacitance voltage at the FD node 42. The amplifier 60 may form, as shown in FIG. 1, a common-drain amplifier, also known as source follower. A gate terminal 62 of the source follower is connected to the FD node 42 and serves as input terminal 62 of the amplifier 60. A common terminal is connected to the supply voltage VDD. The respective amplified signal is generated at an output terminal 64 of the amplifier 60.

The pixel arrangement 10 further comprises a first capacitor 70 and a second capacitor 80. The first capacitor 70 comprises a terminal node 72 and a further terminal node 74. The further terminal node 74 may be connected to a reference potential VSS1, as shown in FIG. 1. Further, the second capacitor 80 comprises a terminal node 82 and a further terminal node 84. The further terminal node 84 may be connected to the reference potential VSS1, as shown in FIG. 1. At least the second capacitor 80 is configured to store the LCG signal representing a first part of the accumulated charge carriers. The first capacitor 70 is configured to store the HCG signal representing a remaining part of the accumulated charge carriers.

The pixel arrangement 10 further comprises a first switch 90 between the output terminal 64 of the amplifier 60 and the first capacitor 70. The first switch 90 is provided for transferring the LCG signal and the HCG signal to one or both of the capacitors 70, 80. The first switch 90 may be formed by a first switching transistor 90. The first switching transistor comprises a gate terminal configured to receive a first switch signal S1. A first terminal of the first switching transistor 90 is connected to the output terminal 64 of the amplifier 60. A second terminal of the first switching transistor 90 is connected to the terminal node 72 of the first capacitor 70.

The pixel arrangement 10 further comprises a second switch 100 arranged between the output terminal 64 of the amplifier 60 and the second capacitor 80. The second switch 100 is provided for transferring the LCG signal or the HCG signal to the second capacitor 80. The second switch 100 may be formed by a second switching transistor 100. The second switching transistor 100 may comprise a gate terminal configured to receive a second switch signal S2. A first terminal of the second switching transistor 100 is connected to the second terminal of the first switching transistor 90 and to the terminal node 72 of the first capacitor 70. A second terminal of the second switching transistor 100 is connected to the terminal node 82 of the second capacitor 80.

The pixel arrangement 10 according to FIG. 1 further comprises a precharge transistor 160 electrically coupled to the output terminal 64 of the amplifier 60. The precharge transistor 160 may be provided for precharging the first capacitor 70 and the second capacitor 80, which can in particular mean that the capacitors 70, 80 are discharged before new signals are stored. The precharge transistor 160 comprises a first terminal connected to the output terminal 64 of the amplifier 60 and a second terminal connected to the reference potential VSS1. By applying a precharge signal PC to the precharge transistor 160 the first and the second capacitor 70, 80 are discharged and a bias current is delivered for the amplifier 60.

In an alternative embodiment, not shown, the second terminal of the precharge transistor 160 is connected to a further reference potential VSS_PC which may be different from the reference voltage VSS1.

The pixel arrangement 10 according to FIG. 1 further comprises a further amplifier 110, which comprises an input terminal 112 electrically connected to the second capacitor 80 and which is configured to generate a pixel output signal at an output terminal 114 of the further amplifier 110. Like the amplifier 60 the further amplifier 110 can be implemented as source follower, where the gate 112 acts an input terminal 112 and a common terminal is connected to the pixel supply voltage VDD.

The pixel arrangement 10 further comprises a select transistor 120 between the output terminal 114 of the further amplifier 110 and a column bus 130 for transferring the pixel output signal to the column bus 130. The select transistor 120 comprises a first terminal connected to the output terminal 114 of the further amplifier 110 and a second terminal connected to the column bus 130. By applying a select signal SEL to the select transistor 120 the pixel output signal is forwarded to the column bus 130.

The pixel arrangement 10 further comprises a coupling transistor 140 between the FD node 42 and the reset transistor 50. Further, the pixel arrangement 10 comprises a third capacitor 150. The third capacitor 150 comprises a terminal node 152 and a further terminal node 154. The further terminal node 154 of the third capacitor 150 is connected to a second further reference potential Vref, which may also be VSS. The coupling transistor 140 comprises a first terminal connected to the FD node 42 and a second terminal connected to the terminal node 152 of the third capacitor 150. By applying a coupling signal DCG to the coupling transistor 140 the FD node 42 is shorted with the terminal node 152 of the third capacitor 150. Thus, a total capacitance is increased and a conversion gain is reduced. The coupling transistor 140 may be named dual conversion gain transistor 140, and the third capacitor 150 may be named dual conversion gain capacitor 150. The coupling signal DCG may be referred to as dual conversion gain signal DCG.

The capacitance of the FD node 42 comprises e.g. a capacitance of the input terminal 62 of the amplifier 60, a capacitance of a pn-junction of a terminal of the transfer transistor 30 and a capacitance of a pn-junction of the first terminal of the coupling transistor 140. Thus, parasitic capacitances of the transistors connected to the FD node 42 may result in the capacitance of the FD node 42. The value of the capacitance of the FD node 42 may be the sum of the values of the parasitic capacitances of the transistors connected to the FD node 42. Optionally, the pixel arrangement 10 includes e.g. a capacitor (not shown) connected to the FD node 42; this capacitor may contribute to the capacitance.

For example, a capacitance of the first capacitor 70 and a capacitance of the second capacitor 80 are equal. The capacitance of the first capacitor 70 is e.g. higher than the value of the capacitance of the FD node 42. The capacitance of the second capacitor 80 is e.g. higher than the value of the capacitance of the FD node 42. A capacitance of the third capacitor 150 is e.g. higher than the value of the capacitance of the FD node 42. The first and the second capacitor 70, 80 are realized e.g. as metal-insulator-metal capacitor or as metal-insulator-semiconductor capacitor. The third capacitor 150 is realized e.g. as metal-insulator-metal capacitor or as metal-insulator-semiconductor capacitor.

The first capacitor 70 and the second capacitor 80 as well as the first switching transistor 90 and the second switching transistor 100 form a sample-and-hold stage being electrically coupled to the diffusion node 42 via the amplifier 60. The amplifier 60 and/or the further amplifier 110 and/or the precharge transistor 160 may be part of the sample-and-hold stage.

Figure 2:
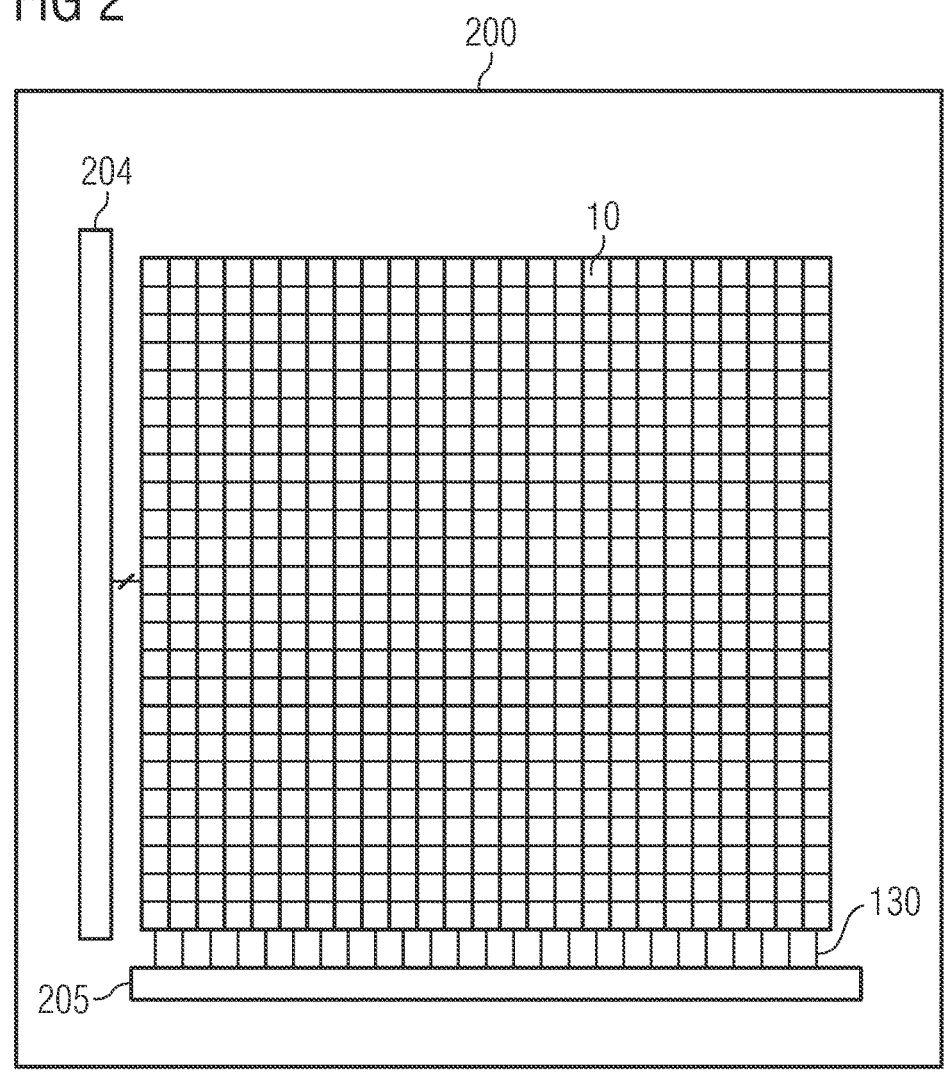
FIG. 2 shows an exemplary embodiment of an image sensor.

FIG. 2 shows an exemplary embodiment of the image sensor 200 with the pixel arrangement 10. The image sensor 200 comprises an array of pixel arrangements 10. Moreover, the image sensor 200 further comprises a row driver 204 that provides the transfer signal TX, the coupling signal DCG, the reset signal RST, the precharge signal PC, the first switch signal S1, the second switch signal S2 and the select signal SEL to the array of pixel arrangements 10. The row driver 204 provides these signals for each of the rows. The image sensor 200 includes an evaluation circuit 205 for digitizing the signals at the column busses 130.

Figure 3:
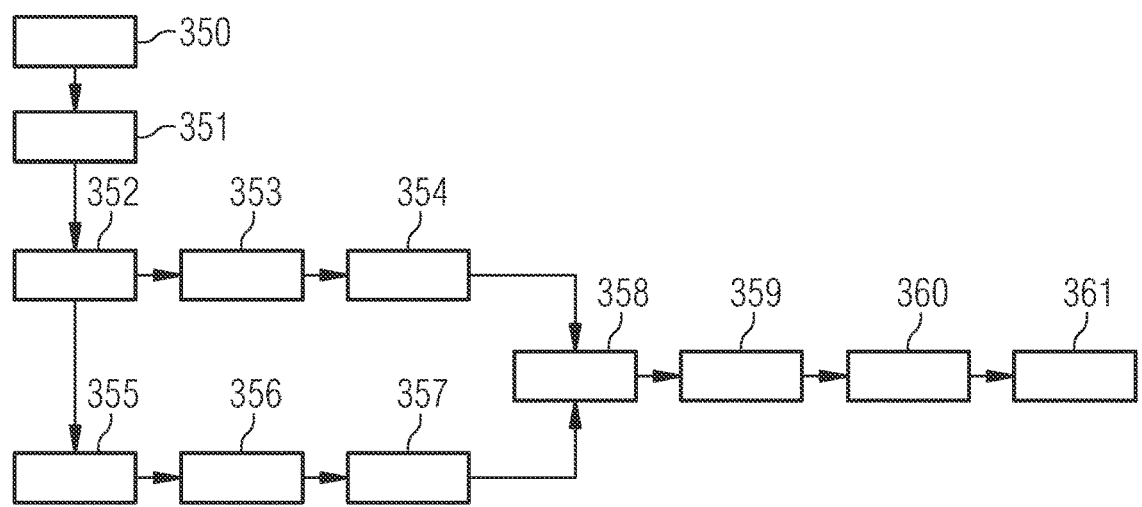
FIG. 3 shows an exemplary operation performed by the pixel arrangement.

In the following, the operation of the pixel arrangement 10 is explained. FIG. 3 shows an exemplary operation performed by the pixel arrangement 10 which is shown in FIG. 1. In FIG. 3 the operation is shown in blocks. A method for operating the pixel arrangement 10 comprises e.g. the following blocks which can be named procedures or steps:

Block 350: Start of exposure: Electromagnetic radiation is converted into charge carriers by the photodiode 20. This means that charge carriers are accumulated in the photodiode 20. This phase may be referred to as exposure period EP. The exposure period EP may be subdivided into several subsequent integration periods T1, T2, T3 etc. The number of integration periods may be at least two.

Block 351: The transfer barrier is modified based on a system input: The transfer signal TX that is provided to the transfer transistor 30 controls a barrier between the photodiode 20 and the FD node 42. The transfer transistor is pulsed to a first voltage level V1 of the transfer signal TX. The first voltage level V1 of the transfer signal TX is selected such that the barrier for a flow of charge carriers between the photodiode 20 and the FD node 42 is lowered. That means that a portion of the accumulated charge carriers is transferred to the FD node 42. After that, charge carriers are continued to be accumulated. The transfer transistor may be pulsed to a second voltage level V2 of the transfer signal TX. The second voltage level V2 of the transfer signal TX may be selected such that the first voltage level V1 is larger than the second voltage level V2. By means of the second pulse a further portion of the accumulated charge carriers is transferred to the FD node 42. Any number of pulses can be applied during total exposure. For example, a third pulse to a third voltage level V3 is applied. In an example, the first voltage level V1 is equal to or larger than the second voltage level V2. In general, the respective voltage level of subsequent pulses may be equal or smaller than the voltage level of a preceding pulse. This can mean that V1≥V2≥V3 etc.

Said portions of accumulated charge carriers are to be drained to the pixel supply voltage Draining said portions to the pixel supply voltage VDD can be conducted by applying the reset signal RST and the coupling signal DCG simultaneously, such that the FD node 42 is electrically connected to the pixel supply voltage VDD. Draining of said portion may be conducted during the exposure period EP or at the end of the exposure period EP or after the exposure period EP, for example at beginning of a storage period FS or in a dedicated draining period D (see FIG. 4).

In other words, during total exposure time the transfer transistor 30 may be pulsed to some partial level n number of times and charge is drained through the DCG transistor 140 and the reset transistor 50 to supply VDD. Thus, multiple barriers can be used during exposure and can be calibrated for using the first barrier level as a reference point further extending dynamic range.

In an example, after a first integration period T1 the transfer transistor 30 is pulsed to a first (partial) voltage level V1 and part of the photodiode charge is drained to supply VDD. Some time after, the transfer transistor 30 can be pulsed again to a second voltage level V2. The time between the first pulse to the first voltage level V1 and the second pulse to the second voltage level V2 may be named second integration period T2. The time after the second pulse to the second voltage level V2 may be named third integration period T3. The first voltage level V1 may be larger than the second voltage level V2, i.e. V1>V2.

Block 352: Transfer of a first part of the charge carriers accumulated by the photodiode 20 to the FD node 42 and the third capacitor 150. A pulse of the transfer signal TX is provided to the transfer transistor 30 which corresponds to the first voltage level V1. That means that the first voltage level V1 is applied to the transfer transistor 30. A pulse of the coupling signal DCG is applied to the coupling transistor 140. The first part of the charge carriers that correspond to the charge carriers accumulated in the last integration period is transferred from the photodiode 20 to the capacitance 40 of the FD node 42 and the third capacitor 150 via the transfer transistor 30 and the coupling transistor 140. Thus, the charge carriers generate a capacitance voltage VC at the input 62 of the amplifier 60. Since an overall capacitance of the FD node and the third capacitor is large, a gain of the signal applied at the input terminal 62 of the amplifier 60 is reduced (low gain).

Block 353: In a first phase FS1 of the storage period FS, store the first part of charge carriers on the first and the second capacitor 70, 80: The first and the second switching transistors 90, 100 are set in a conducting state for transferring the first part of charge carriers to the second capacitor 80 from the FD node 42. This can mean that the amplified capacitance voltage is applied to the first and the second capacitor 70, 80. The second switch signal S2 may have a short pulse for equalizing the voltages at the first and the second capacitor 70, 80. This can mean that the signal is redistributed on the first and the second capacitor 70, 80. Said amplified capacitance voltage corresponds to the low conversion gain (LCG) signal.

Block 354: In a first phase RO1 of the readout period RO, readout of the second capacitor 80: An output voltage V0 tapped at the second capacitor 80 is amplified by the further amplifier 110. In case the select transistor 120 is set in a conducting state in a first readout phase RO1 of the readout period RO, the amplified output voltage is provided to the column line 130 for digitization. A first digitized value is generated as a function of a first value of the output voltage V0, e.g. by an evaluation circuit (shown in FIG. 2). Said first value of the output voltage V0 corresponds to the LCG signal.

Block 355: Transfer the remaining charge carriers to the FD node 42: A second pulse of the transfer signal TX is applied to the transfer transistor 30 for transferring the remaining charge carriers from the photodiode 20 to the FD node 42. The second pulse may correspond to a full voltage level Vf of the transfer transistor 30, so that the barrier between the photodiode 20 and the FD node 42 is minimized or removed.

The first voltage level V1 of the transfer signal results in a higher barrier than the full voltage level Vf. In an example, V1<Vf. The coupling transistor 140 remains in a non-conducting state, so that the single capacitance of the FD node 42 results in a high gain of the signal applied at the input terminal 62 of the amplifier 60.

Block 356: In a second phase FS2 of the storage period FS, store the remaining charge carriers accumulated by the photodiode 20 on the first capacitor 70. This can mean that the capacitance voltage VC that is tapped at the FD node 42 is amplified by the amplifier 60. The amplified capacitance voltage is provided to the first capacitor 70 by providing a pulse of the first switch signal S1 to the first switching transistor 90. Said amplified capacitance voltage corresponds to the high conversion gain (HCG) signal.

Block 357: In a second phase RO2 of the readout period RO, readout of the first capacitor 70: After the output voltage V0 at the second capacitor 80 has been readout in block 354 in the first readout phase RO1, the second switching transistor 100 is set in a conducting state. Thus, the voltages at the first capacitor 70 and at the second capacitor 80 equalize. Since the capacitance voltage VC is still amplified by the amplifier 60, the output voltage V0 at the second capacitor 80 is equal to the amplified capacitance voltage. The output voltage V0 is amplified by the further amplifier 110. When the select transistor 120 is set in a conducting state in the second readout phase RO2 of the readout phase RO, the amplified output voltage is provided to the column line 130 for digitization. A second digitized value is generated as a function of a second value of the output voltage V0 by the evaluation circuit. Said second value of the output voltage V0 corresponds to the HCG signal.

Typically, the steps of the blocks 352, 353, 355, 356 are performed in the frame storage period FS. The steps of the blocks 354, 357 are performed in the readout period RO.

Block 358: Subtract a voltage of the second capacitor 80 or a digitized value of the voltage of the second capacitor 80 from a voltage of the first capacitor 70 or a digitized value of the voltage of the first capacitor 70: An output signal which represents an illumination IL of the photodiode 20 is a function of the first digitized value (resulting from block 353) and of the second digitized value (resulting from block 357). In an example, the first digitized value (resulting from block 353) is subtracted from the second digitized value (resulting from block 357) by the evaluation circuit. By this operation the HCG signal may be accessed with correlated double sampling (CDS), since the first (digitized) value and the second (digitized) value are based on a common noise level.

Block 359: Gain up the LCG signal. This can mean that the LCG signal is adjusted. In particular, the LCG signal may be amplified. Adjusting or amplifying the LCG signal may be performed by the evaluation circuit 205. The LCG signal is sampled with a lower gain by means of the third capacitor 150 (dual conversion gain capacitor 150) to increase the dynamic range. In order to correct for this gain adjustment, the LCG signal is gained up in block 359. In addition, the LCG signal may be accessed with double delta sampling (DDS). The LCG signal is used in case of high illuminance, where thermal noise is less relevant since photon shot noise is dominant. Thus, correlated double sampling to remove the noise from the video signal is not necessary. However, it might be desired to remove fixed pattern noise (FPN) from the video signal. By performing double delta sampling (DDS) FPN can be removed from the LCG signal. DDS can be performed by subtracting a reset level from the LCG signal, wherein the reset level can be readout in a third phase RO3 of the readout period RO after the second readout phase RO2.

Block 360: Per pixel knee point calibration: The HCG signal contains the first calibration level needed in post processing to remove FPN caused by variations of the transfer transistors 30 affecting the threshold voltage of the transfer transistors 30. Since the same first voltage level V1 that has been applied for barrier modulation during the exposure period is also applied during frame storage, the HCG signal comprises the knee point calibration value needed during linearization and for FPN correction. The knee point correction for further pulses (e.g. to the second voltage level V2) of the transfer transistor 30 during integration can be mapped and utilize the exact calibration value of the first voltage level V1 as a reference point. The calibration value will also be used as a reference to remove FPN variation caused by the additional pulses that occurred during integration. Since any number of pulses can be applied during total exposure, the exact calibration value of the first voltage level V1 can be also be used as a reference to correct for such further pulses. For example, in case of a third pulse to a third voltage level V3, one could correct for the V3 pulse by using the V1 exact level as a reference. The knee point calibration is performed for each pixel separately. Further, the pixel arrangement 10 is self-calibrating, since the barrier information is contained in the HCG signal. Thus, no additional read is necessary. Block 360 is optional.

Block 361: Linearization. It is possible to reconstruct a linearized pixel output signal, i.e. a pixel output signal that linearly depends on the illumination level. Such reconstruction is explained below. The duration of the integration periods may be used to reconstruct the pixel output signal. The voltage levels V1, V2 etc. of the pulse for barrier modulation of the transfer transistor 30 may optionally be used to reconstruct the pixel output signal.

Figure 4:
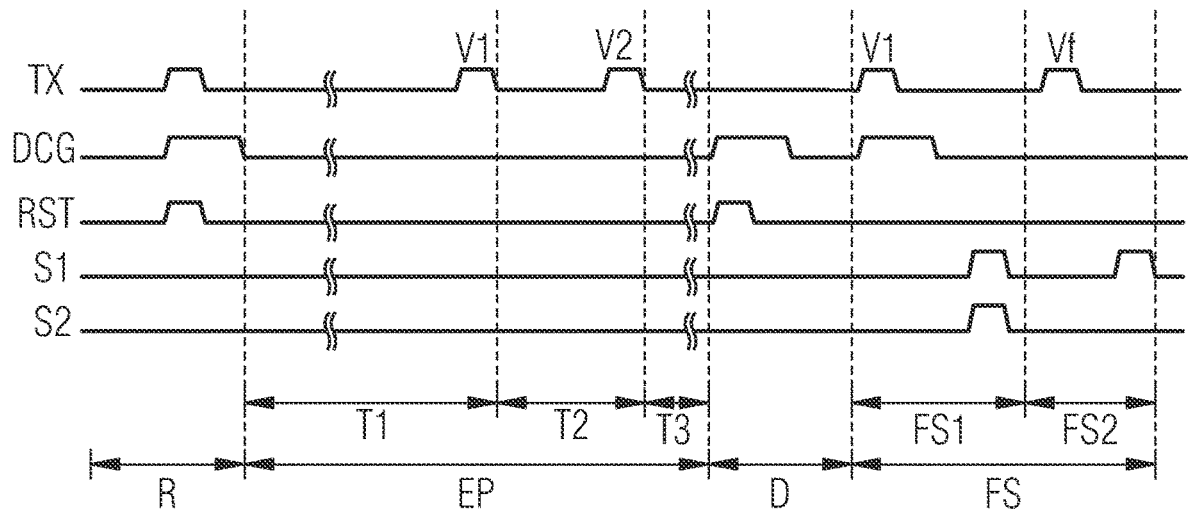
FIG. 4 shows an exemplary signal timing for the pixel arrangement.

FIG. 4 shows an exemplary timing diagram performed by a pixel arrangement 10 which is shown e.g. in FIG. 1. The following signals are shown as a function of time: The transfer signal TX, the coupling signal DCG, the reset signal RST, the first switch signal S1 and the second switch signal S2. It should be noted that the signal timing shown is more of an example and could be varied. Furthermore, the scaling of the time intervals should not be taken as an exact indication.

FIG. 4 shows a reset period R, an exposure period EP, a draining period D, and a (frame) storage period FS. A readout period RO is not shown. The readout period RO would follow the storage period FS. The storage period FS follows the exposure period EP. The exposure period EP follows the reset period R. The exposure period EP includes the first, the second and the third integration periods T1, T2 and T3. The third integration period follows the second integration period T2, which follows the first integration period T1. The storage period FS includes a first and a second storage phase FS1, FS2. The second storage phase FS2 follows the first storage phase FS1. The storage period FS may be a global storage period for each pixel within the pixel array. The readout period RO may be performed for each row separately. Therefore, there may be a time gap between the second storage phase FS2 and the readout period RO.

During the reset period R a reset signal RST, a coupling signal DCG and a transfer signal TX is applied. This can mean that the reset transistor 50, the coupling transistor 140 (dual conversion gain transistor 140), and the transfer transistor 30 are pulsed, resulting in any redundant charge carriers to be drained by connecting the photodiode 20 and the FD node 42 to the pixel supply voltage VDD. The transfer transistor 30 may be pulsed to the full voltage level Vf.

During the first integration period T1 charge carriers are accumulated by the photodiode 20. The amount of accumulated charge carriers depends on the duration of the first integration period T1. At an end of the first integration period T1, the transfer gate 30 is pulsed to a first voltage level V1. This leads to a transfer of a portion of the accumulated charge carriers to the diffusion node 42. Said portion is configured to be drained to the pixel supply voltage VDD in a later phase.

After said pulse of the transfer gate 30, charge carriers are continued to be accumulated in the second integration period T2 by the photodiode 20. The second integration period T2 may be shorter than the first integration period T1. The amount of accumulated charge carriers in the second integration period T2 depends on the duration of the second integration period T2.

At an end of the second integration period T2, the transfer gate 30 is pulsed to a second voltage level V2, which may be smaller than the first voltage level. This leads to a transfer of a further portion of the accumulated charge carriers to the diffusion node 42. Said further portion is also configured to be drained to the pixel supply voltage VDD in a later phase.

After said pulse of the transfer gate 30, charge carriers are continued to be accumulated in the third integration period T3 by the photodiode 20. The third integration period T3 may be shorter than the second integration period T2. The amount of accumulated charge carriers in the third integration period T3 depends on the duration of the third integration period T3.

In the subsequent draining period, a reset pulse RST and a coupling pulse DCG is applied at the end of the third integration period T3. This removes any redundant charge carriers from the diffusion node 42, in particular the portions of accumulated charge carriers transferred during the exposure period by means of the TX pulses (V1, V2 etc.). Thus, said portions are drained to the pixel supply voltage VDD.

In the following first storage phase FS1 of the storage period FS, the transfer gate 30 is pulsed to the first voltage level V1 again. This leads to a transfer of a first part of the accumulated charge carriers to the FD node 42. Said first part may correspond to the charge carriers accumulated during the last integration period, e.g. the third integration period T3. Simultaneously, the coupling signal DCG goes high to reduce the gain by shorting the FD node 42 with the third capacitor 150. Then, the first and the second switch signals S1, S2 are applied for storing the LCG signal representing the first part of the accumulated charge carriers on the pair of capacitors 70, 80, that are electrically coupled to the FD node 42 via the source follower 60. The LCG signal may be redistributed on the first capacitor 70 and the second capacitor 80.

The second storage phase FS2 follows by pulsing the transfer transistor 30 to the full voltage level Vf for transferring a remaining part of the accumulated charge carriers to the FD node 42. All remaining charge carriers are transferred. The coupling signal DCG remains low, such that a high conversion gain is achieved. Then, the first switch signals S1 is applied to the first switch 90 for storing the HCG signal representing the remaining part of the accumulated charge carriers on the first capacitor 70.

Figure 5:
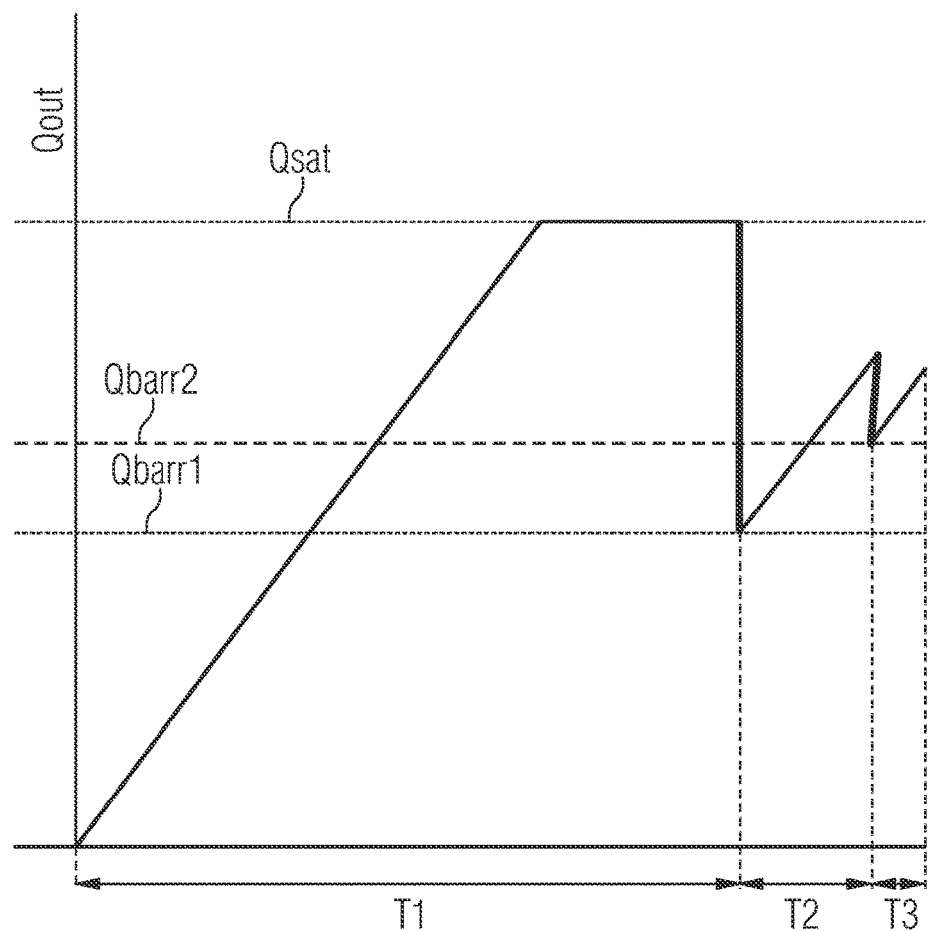
FIG. 5 shows the charge at the photodiode during barrier modulation.

FIG. 5 further illustrates the barrier modulation and complements the timing diagram of FIG. 4 with regard to the exposure period EP. In FIG. 5 the charge Qout accumulated during the exposure period EP at the photodiode 20 is shown over time. In the first integration period T1 charge is accumulated at the photodiode 20. In turn, the charge signal Qout increases. The accumulated charges may reach a saturation level Qsat, as shown in FIG. 5. At the end of the first integration period T1 the barrier is modulated by a pulse to the first voltage level V1. This results is a drop of the charge signal Qout at the photodiode 20. The charge signal Qout drops to a first barrier level Qbarr1 corresponding to the first voltage level V1. In the second integration period T2 the charge signal Qout continues to increase from the first barrier level Qbarr1 due to photoconversion at the photodiode 20. At the end of the second integration period T2 a pulse to the second voltage level V2 is applied, which leads to a further drop of the charge signal Qout. If the second voltage level V2 is smaller than the first voltage level V1, the charge signal Qout drops to a second barrier level Qbarr2 that is higher than the first barrier level Qbarr1. In the third integration period T3 the charge signal Qout continues to increase from the second barrier level Qbarr2 due to photoconversion at the photodiode 20. The charge that corresponds to the signal drops shown in FIG. 5 is drained to supply, as explained above. Thus, the charge signal Qout at the photodiode 20 is affected by both skimming operations/barrier modulations.

Figure 6:
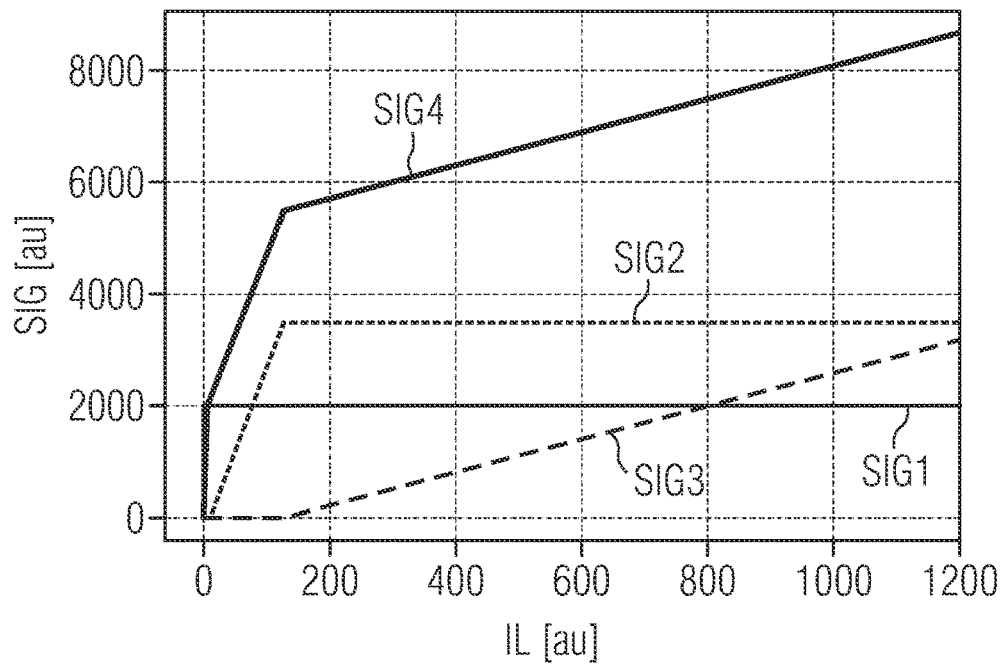
FIG. 6 shows an exemplary characteristic of the pixel arrangement.

FIG. 6 shows an exemplary characteristic of a pixel arrangement 10. A response signal SIG in artificial units is shown as a function of an illumination IL in artificial units. The response signal SIG may be the charge equivalent signal on the sample-and-hold capacitors (the first and the second capacitor 70, 80). A signal SIG1 (narrow solid line) is the signal resulting from the first integration period T1. It saturates for higher exposure levels as pulsing the transfer gate 30 to the first voltage level V1 leads to draining excess charge carriers to the pixel supply voltage VDD.

A signal SIG2 (dotted line) is the signal that results from the second integration period T2. The slope of signal SIG2 is less steep than the slope of signal SIG1 since the integration period T2 may be shorter than the integration period T1. Alternatively or additionally, the slope of signal SIG2 is less steep than the slope of signal SIG1 as both signals are obtained at different conversion gains. For example, the signal SIG1 (up to the knee point) is obtained at high conversion gain. For example, the signal SIG2 is obtained at low conversion gain. Thus, the slope depends e.g. on a value of the capacitance of the FD node 42 and on the capacitance value of the third capacitor 150. The slope difference depends on the gain ratio. The signal SIG2 may saturate for higher illumination levels, as pulsing the transfer gate 30 to the first voltage level V2 leads to draining excess charge carriers to the pixel supply voltage VDD.

A signal SIG3 (dashed line) is the signal that results from the third integration period T3. The slope of signal SIG3 is less steep than the slope of signal SIG2 since the integration period T3 may be shorter than the integration period T2. Alternatively or additionally, the slope of signal SIG3 is less steep than the slope of signal SIG2 as both signals are obtained at different conversion gains. For example, the signal SIG2 (up to its knee point) is obtained at high conversion gain. For example, the signal SIG3 is obtained at low conversion gain. Thus, the slope depends e.g. on a value of the capacitance of the FD node 42 and on the capacitance value of the third capacitor 150. The slope difference depends on the gain ratio.

An output signal SIG4 (broad solid line) is the signal obtained by a combination of the signals SIG1, SIG2 and SIG3. Further, the output signal SIG3 may be a function of the signal SIG1, the signal SIG2, the signal SIG3 and a reset signal (not shown). By combining the signals SIG1, SIG2 and SIG3 the dynamic range of the pixel arrangement 10 can be increased. The exact saturation level of the signal SIG1 can be determined from the HCG signal, since the HCG signal corresponds to the remaining charge carriers after the pulse to the first voltage level V1. This can mean that the signal SIG1 corresponds to the HCG signal. The signal SIG3 may correspond to the LCG signal. Further, the exact saturation level of the signal SIG2 can be determined from the HCG signal, too, based on the knowledge of the durations of the integration periods T1-T3 and the voltage levels V1-V2. In other words, the knee point correction for V2 will be mapped and utilize V1 exact calibration value as a reference point.

Figure 7:
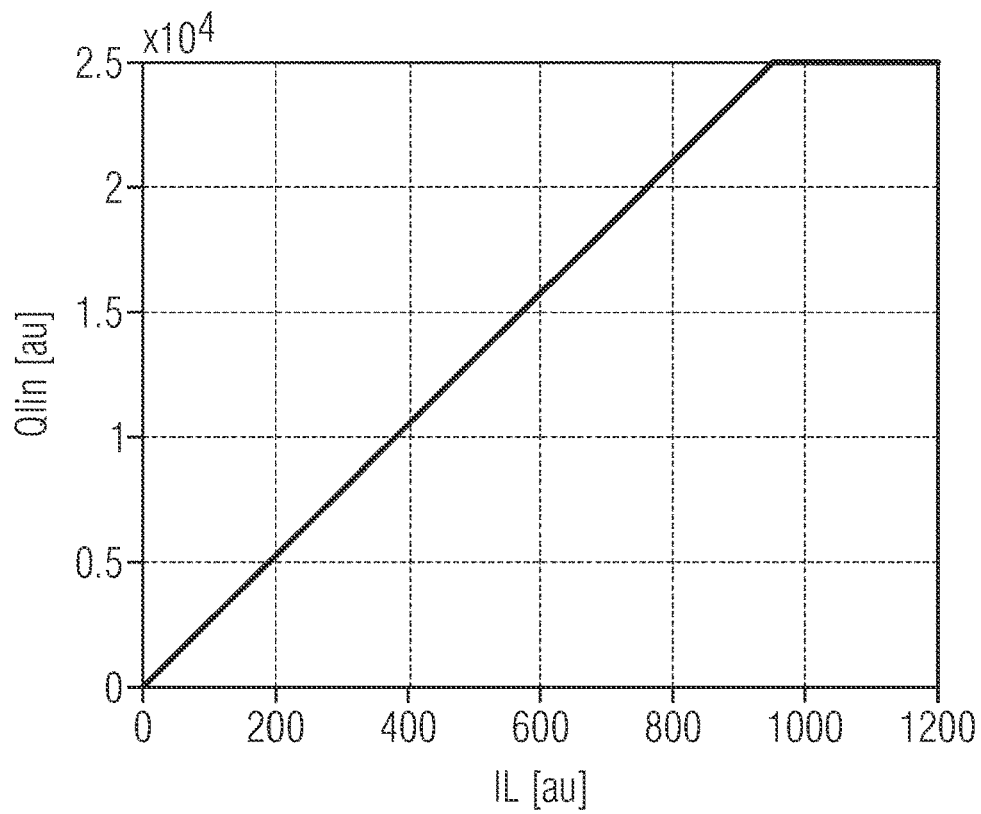
FIG. 7 shows a linear reconstructed signal.

FIG. 7 shows a reconstructed linear signal Qlin in dependence on the light intensity IL. The linearized signal Qlin and the light intensity/illumination are shown in artificial units. It is to be noted that the intensity range shown in FIG. 7 corresponds to the intensity range shown in FIG. 6. The linearized signal Qlin is the effective signal after reconstruction. The linearized signal Qlin may be based on the signals SIG1, SIG2 and SIG3 shown in FIG. 6. This can mean that the linearized signal Qlin is reconstructed using the signals SIG1 to SIG3 obtained during the exposure period EP. As shown, the linearized signal Qlin may saturate for very high illumination levels. However, due to the barrier modulation the dynamic range is increased.

Figure 8:
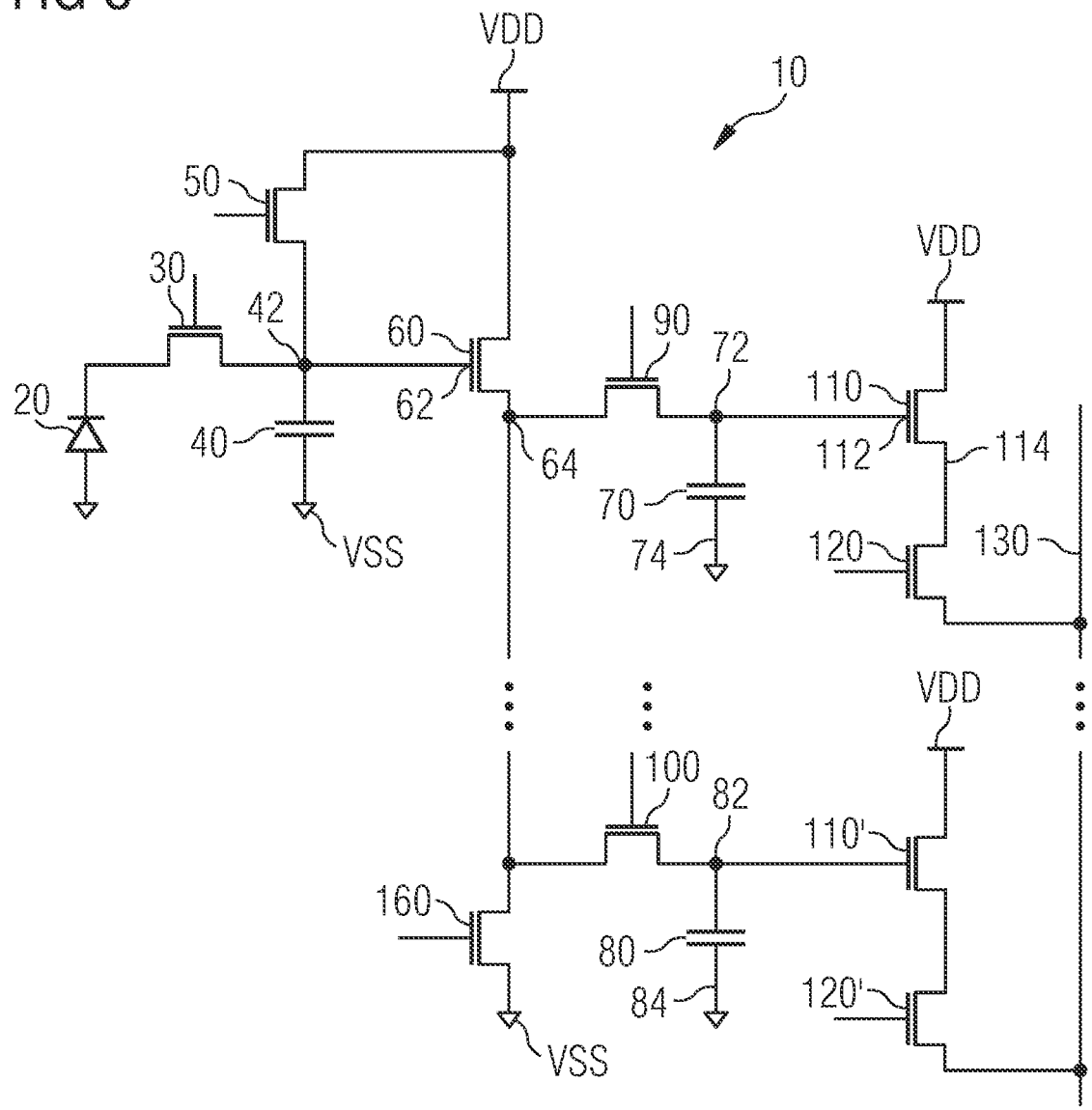
FIG. 8 shows another exemplary embodiment of a pixel arrangement.

In FIG. 8 another embodiment of the pixel arrangement 10 is shown. The embodiment according to FIG. 8 is different from the embodiment according to FIG. 1 in that the capacitors 70, 80 are not arranged cascaded, but in parallel. This means that the second switch 100, which is coupled to the second capacitor 80, is directly connected to the output terminal 64 of the amplifier 60, and not as in FIG. 1 via the first switch 90. It should be noted that the precharge gate 160 can also be implemented as constant current source configured to provide a fixed current. Further, the embodiment according to FIG. 8 further comprises a second further amplifier 110' and further select gate 120' coupled to the second capacitor 80, while the further amplifier 110 and the select gate 120 are coupled to the first capacitor 70. It should be noted, however, that the embodiment shown illustrates a parallel arrangement of the capacitors 70, 80 byway of example only. Other arrangements are possible. For example, the parallel arranged capacitors 70, 80 could share a common further amplifier 110 by means of additional switches. It will be appreciated by a skilled person how to implement a similar signal timing as shown in FIG. 4. However, the signal timing may change slightly during frame storage and readout, since the first switch and the second switch can be operated independently.

The pixel arrangement 10 may comprise further capacitors arranged in a similar way, as indicated in FIG. 8 by the ellipsis. In this way, at least one further signal may be stored on the further capacitors. The further signals may correspond to the signals shown in FIG. 6. For example, the further signal may correspond to the signal SIG2. The signal SIG2 indicates a further calibration level which may correspond to its saturation level. Thus, the pixel output signal may be determined based on the further calibration level. In this case, the method for operating the pixel arrangement 10 may comprise more storage phases, e.g. a third storage phase FS3, in which the further signal is stored on the further capacitor. The further storage phase may be prior to the first storage phase FS1. The further storage phase may be introduced by a pulse of the transfer transistor 30 to a respective voltage level, e.g. the second voltage level V2. In general, the pixel arrangement 10 may comprise n number of sample-and-hold (S/H) capacitors allowing n more self-calibrating points where all reads except the first are CDS reads (first read is DDS). Thus, the dynamic range can be extended and the calibration levels corresponding to the multiple barriers, which are needed for knee point calibration and linearization, can be accessed directly.

Figure 9:
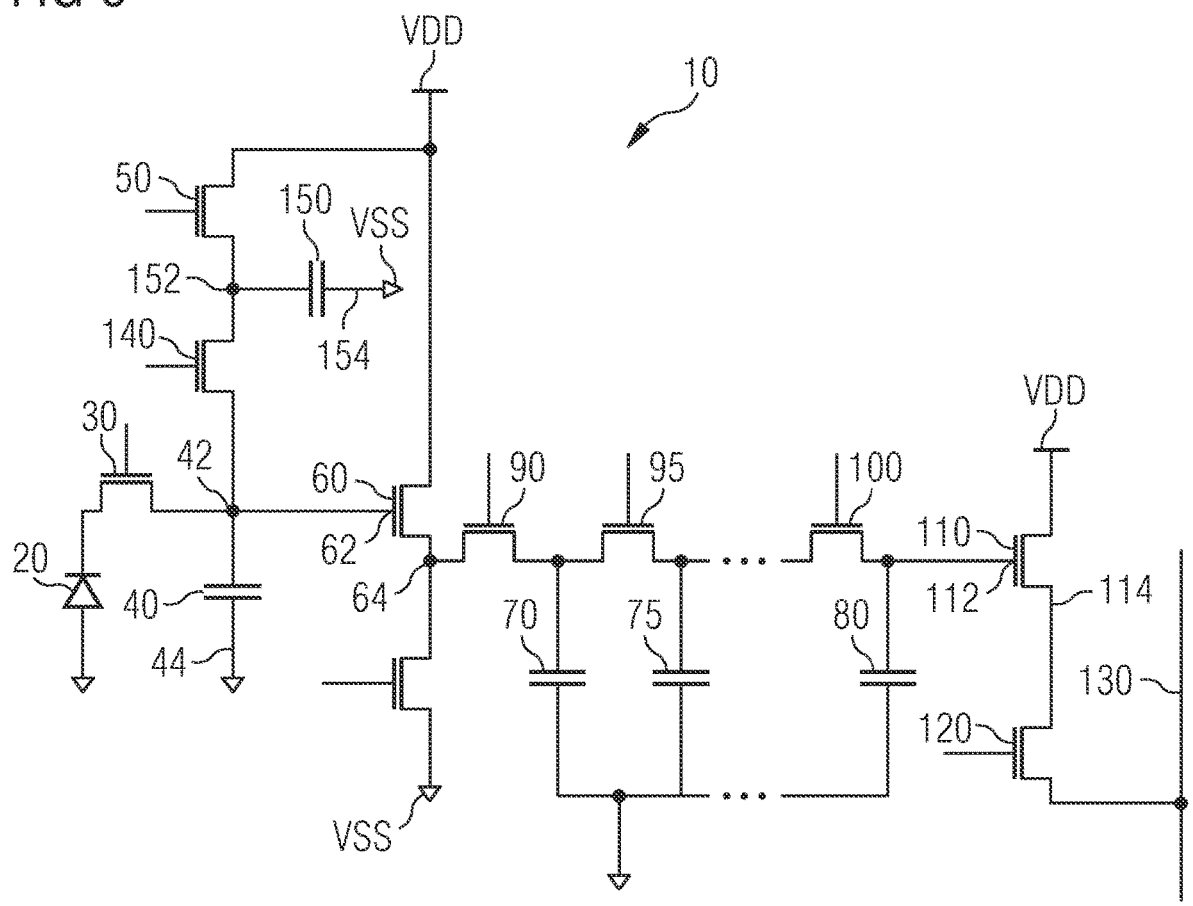
FIG. 9 shows another exemplary embodiment of a pixel arrangement.

In FIG. 9 another embodiment of the pixel arrangement 10 is shown. The embodiment according to FIG. 9 is different from the embodiment according to FIG. 1 in that it comprises a further capacitor 75 arranged cascaded with the first capacitor 70 and the second capacitor 80. A further switching transistor 95 is assigned to the further capacitor 75. That is, the further switching transistor 95 connects a terminal node of the first capacitor 70 to a terminal node of the further capacitor 75. The second switching transistor 100 connects the terminal node of the further capacitor 75 to a terminal node of the second capacitor 80. The pixel arrangement 10 may comprise second further capacitors arranged in a similar way as indicated by the ellipsis. As in the embodiment of FIG. 8, at least one further signal may be stored on the (further) capacitors 70, 75, 80, such that more self-calibrating points can be stored to determine the pixel output signal. For that, the method for operating the pixel arrangement 10 may comprise more storage phases, e.g. a third storage phase FS3, in which the further signal is stored on the further capacitor 75 or redistributed on at least some of the S/H capacitors 70, 75, 80, respectively. In that way, the calibration levels corresponding to the multiple barriers can be accessed directly.

Figure 10:
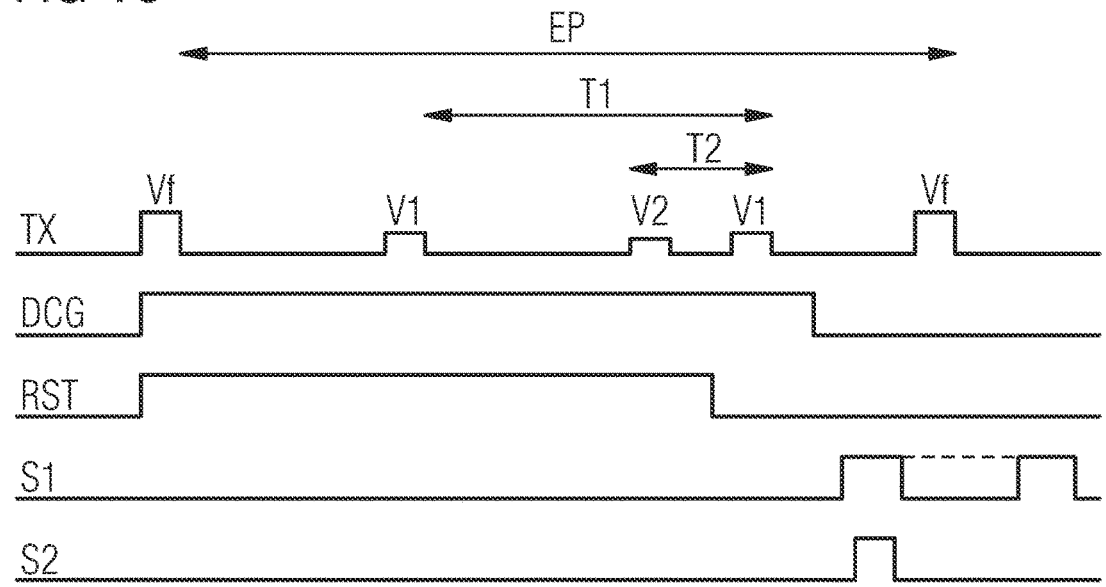
FIG. 10 shows another exemplary signal timing for the pixel arrangement.

FIG. 10 shows a timing diagram according to another embodiment of the operating method performed by a pixel arrangement 10 shown in FIG. 1. As in FIG. 4, the following signals are shown as a function of time: The transfer signal TX, the coupling signal DCG, the reset signal RST, the first switch signal S1 and the second switch signal S2. It should be noted that the signal timing shown is more of an example and could be varied. Furthermore, the scaling of the time intervals should not be taken as an exact indication.

The timing includes an exposure period EP, during which charge carriers are accumulated with the photodetector 20 comprised by the pixel arrangement 10. Before the exposure period EP a TX pulse to the full voltage level Vf is applied to the transfer transistor 30. Since the reset signal RST and the coupling signal DCG are high at the same time, this leads to a reset of the photodiode 20 and the diffusion node 42, where any redundant charge carriers are removed, so that the pixel arrangement 10 is ready to capture a new frame. The coupling signal DCG and the reset signal RST may stay high for a predetermined period within the exposure period EP, as shown in FIG. 10.

During the accumulation of charge carriers, i.e. during the exposure period EP, the following steps are performed:

The transfer transistor is pulsed to a first voltage level V1 to transfer a portion of the accumulated charge carriers to the diffusion node 42. Said portion is configured to be drained to the supply voltage, which is achieved by the fact that both the coupling signal DCG and the reset signal RST are high. Thus, the floating diffusion node 42 is electrically connected to the pixel supply voltage VDD.

Then, the transfer transistor 30 is pulsed to a second voltage level V2 for transferring a further portion of the accumulated charge carriers to the diffusion node 42. The second voltage level V2 is lower than the first voltage level V1, resulting in a higher barrier between the photodiode 20 and the diffusion node 42. Said further portion is configured to be drained to the supply voltage VDD, which is achieved by the fact that both the coupling signal DCG and the reset signal RST are still high. After that, the reset signal RST drops, so that the diffusion node 42 is no longer connected to the pixel supply voltage VDD.

Then, the transfer transistor 30 is pulsed to the first voltage level V1 for transferring a first part of the accumulated charge carriers to the diffusion node 42. A representation of the first part is configured to be stored as low conversion gain signal, LCG signal. The LCG signal is stored with a low conversion gain, which is achieved by the fact that the DCG signal is still high, so that the diffusion node 42 is electrically connected to the coupling capacitor 150, resulting in an increased capacitance.

The low conversion gain signal representing the first part of the accumulated charge carriers is stored on the second capacitor 80 coupled to the diffusion node 42 via the amplifier 60 and the switching transistors 90, 100. This is achieved by both switch signals S1 and S2 going high. The low conversion gain signal may be redistributed on the first capacitor 70 and the second capacitor 80. After that, the coupling signal DCG goes low to increase the conversion gain, as the diffusion node 42 is no longer connected to the coupling capacitor 150.

At an end of the exposure period, the transfer transistor 30 is pulsed to the full voltage level Vf for transferring a remaining part of the accumulated charge carriers to the diffusion node 42. A representation of the remaining part is configured to be stored as high conversion gain signal, HCG signal. The HCG signal is stored with a high conversion gain, which is achieved by the fact that the DCG signal is low.

After said pulsing to the full voltage level Vf, the high conversion gain signal representing the remaining part of the accumulated charge carriers is stored on the first capacitor 70 coupled to the diffusion node 42 via the amplifier 60 and the first switching transistors 90. This is achieved by the first switch signal S1 going high. Alternatively, the first switch signal S1 may remain high after storing the LCG signal, as indicated by the dashed line. During a readout period (not shown), the low conversion gain signal and the high conversion gain signal stored on the capacitors are read and forwarded to an evaluation circuit via the column bus 130.

In the shown example, the period from the first pulse to the first voltage level V1 to the second pulse to the first voltage level is denoted by T1. The period from the pulse to the second voltage level V2 to the second pulse to the first voltage level is denoted by T2. The LCG signal provides information on the exposure during period T1 and period T2.

The HCG signal provides information on the total exposure during the exposure period (low light) or first barrier (high light). Reconstructing a linearized signal depends on the light conditions:

In the following, a signal corresponding to a reset level minus the LCG signal is referred to as DDS signal. A signal corresponding to the LCG signal minus the HCG signal is referred to as CDS signal.

At low light conditions where none of the barrier pulses TX affect the photodiode charges, reconstruction is achieved by reading the CDS signal.

At low to mid light conditions where only the second barrier pulse TX (pulse to the second voltage level V2) affects the photodiode charges, reconstruction is achieved by summing the DDS signal and the DDS signal in digital domain.

At mid to high light conditions where both barrier pulses (to the first and the second voltage level) affect the photodiode charges, reconstruction is achieved, by using only the DDS signal. For linearization, it is multiplied by the ratio of the periods EP/T1.

At mid to high light conditions where both barrier pulses TX affect the photodiode charges, reconstruction is achieved by using only the DDS signal. An offset (second barrier level Qbarr2−first barrier level Qbarr1) can be subtracted. The first barrier level Qbarr1 is equal to the CDS read, the second barrier level Qbarr2 can be estimated.

For linearization, the DDS signal after offset removal is multiplied by the ratio of the periods EP/T2.

The shown example illustrates a method for operating a pixel arrangement 10 by using barrier modulation with two barriers. However, the method can be extended with additional barriers, as the practiced reader will easily recognize.

Figure 11:
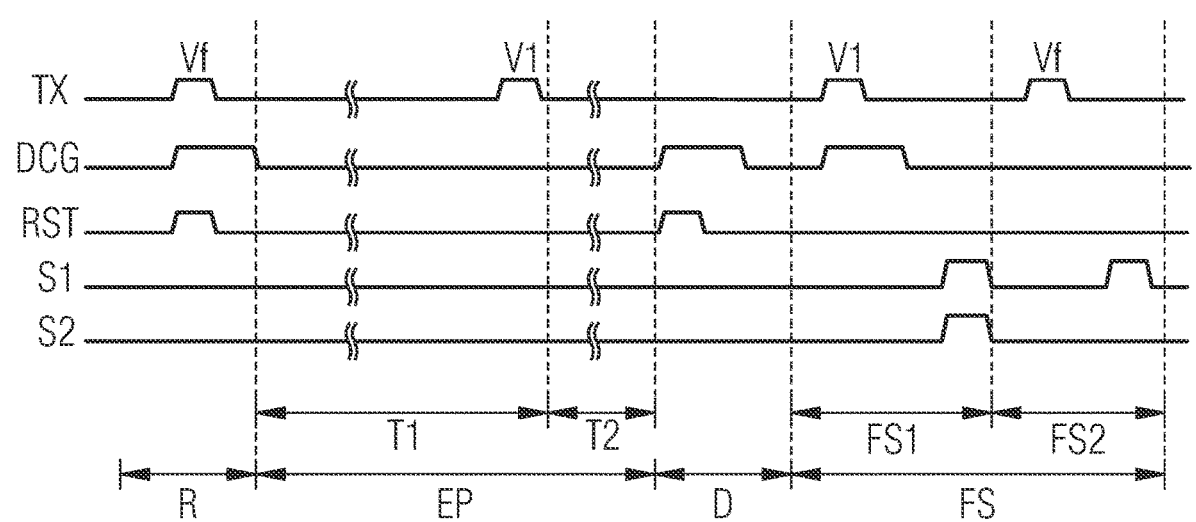
FIG. 11 shows another exemplary signal timing for the pixel arrangement.

FIG. 11 shows another signal timing for the pixel arrangement 10 shown in FIG. 1. The signal timing according to FIG. 11 is similar to that of FIG. 4 with the difference that the transfer transistor 30 is not pulsed to the second voltage level V2. Thus, the exposure period only comprises the first and the second integration periods T1, T2. In other words, the method of operating the pixel arrangement 10 utilizes only one barrier of the transfer transistor 30 to increase the dynamic range. For a further description of FIG. 11, it is referred to the comments on FIG. 4.

Figure 12:
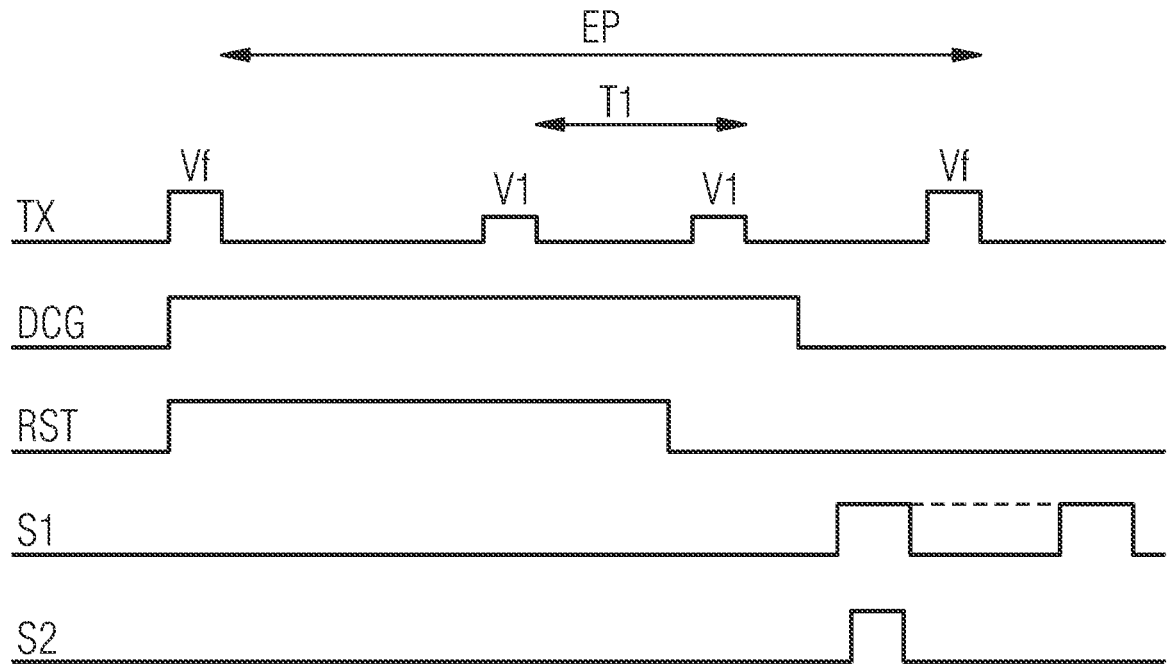
FIG. 12 shows another exemplary signal timing for the pixel arrangement.

FIG. 12 shows another signal timing for the pixel arrangement 10 shown in FIG. 1. The signal timing according to FIG. 12 is similar to that of FIG. 10 with the difference that the transfer transistor 30 is not pulsed to the second voltage level V2. In other words, the method of operating the pixel arrangement 10 utilizes only one barrier of the transfer transistor 30 to increase the dynamic range. For a further description of FIG. 12, it is referred to the comments on FIG. 10.

Figure 13:
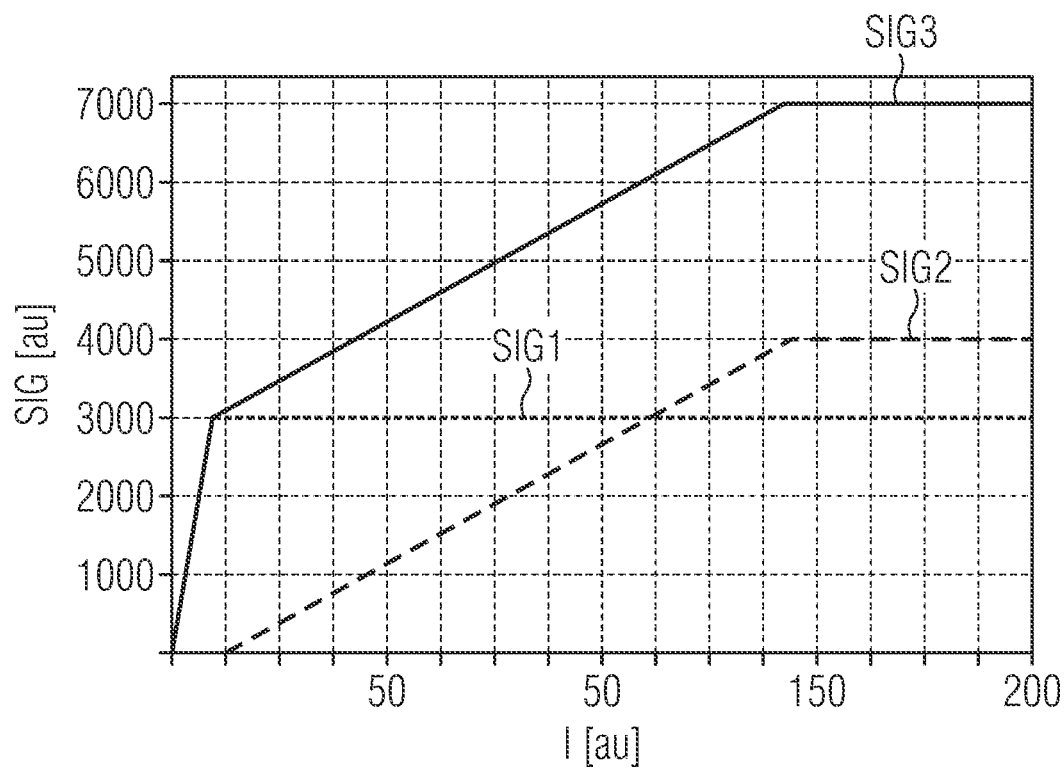
FIG. 13 shows another exemplary characteristic of the pixel arrangement.

FIG. 13 shows another exemplary characteristic of a pixel arrangement 10 that utilizes only one barrier as shown in FIG. 11 or 12. As in FIG. 6, a response signal SIG in artificial units is shown as a function of an illumination IL in artificial units. The response signal SIG may be the charge equivalent signal on the sample-and-hold capacitors. An output signal SIG3 is the signal obtained by a combination of signals SIG1 and SIG2. Further, the output signal SIG3 may be a function of the signal SIG1, the signal SIG2 and a reset signal (not shown). By combining the signals SIG1, SIG2 the dynamic range of the pixel arrangement 10 can be increased.

The signal SIG2 is the signal resulting from the integration period between the first pulsing to the first voltage level V1 and the second pulsing to the first voltage level V1 (the first integration period T1 according to FIG. 12). It may represent the LCG signal. The signal SIG1 is the low light signal, i.e. it may represent the HCG signal. The signal SIG1 may result from the total exposure period EP. It saturates for high illumination levels. The saturation level can be used as calibration level to reconstruct the output signal at high illumination levels. The slope difference between SIG1 and SIG2 may depend on the gain ratio and/or on different integration periods. For further details it is referred to the description of FIG. 6.

The embodiments of the pixel arrangement 10 and the method of operating such pixel arrangement 10 disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pixel arrangement comprising:
   a photodetector configured to accumulate charge carriers by converting electromagnetic radiation;
   a transfer transistor electrically coupled to the photodetector;
   a diffusion node electrically coupled to the transfer transistor;
   a reset transistor electrically coupled to the diffusion node and to a pixel supply voltage; and
   a sample-and-hold stage comprising at least a first capacitor and a second capacitor, an input of the sample-and-hold stage being electrically coupled to the diffusion node via an amplifier,
   wherein the transfer transistor is configured to be pulsed to different voltage levels for transferring parts of the accumulated charge carriers to the diffusion node,
   wherein at least the second capacitor is configured to store a low conversion gain signal representing a first part of the accumulated charge carriers, and
   wherein the first capacitor is configured to store a high conversion gain signal representing a remaining part of the accumulated charge carriers.

2. The pixel arrangement according to claim 1, wherein the low conversion gain signal and the high conversion gain signal comprise a common noise level, and wherein the high conversion gain signal indicates a calibration level for adjusting a pixel output signal depending from a pixel specific knee point value.

3. The pixel arrangement according to claim 1, further comprising:
- a dual conversion gain transistor, and
- a dual conversion gain capacitor,
- wherein the dual conversion gain transistor connects the diffusion node to a terminal node of the dual conversion gain capacitor, and
- wherein the reset transistor is electrically coupled to the diffusion node via the terminal node and the dual conversion gain transistor.

4. The pixel arrangement according to claim 1, further comprising at least two switching transistors, wherein each switching transistor is assigned to a respective capacitor of the sample-and-hold stage and couples a terminal node of the respective capacitor to the input of the sample-and-hold stage.

5. The pixel arrangement according to claim 1, wherein the sample-and-hold stage comprises exactly two capacitors.

6. The pixel arrangement according to claim 1, wherein the sample-and-hold stage further comprises a predetermined number of additional capacitors, each of the additional capacitors being configured to store an additional signal representing a further part of the accumulated charge carriers.

7. The pixel arrangement according to claim 1, further comprising:
- a further amplifier coupled to an output of the sample-and-hold stage; and
- a select transistor electrically connecting the further amplifier to a column bus.

8. An image sensor comprising:
the pixel arrangement according to claim 1.

9. A method for operating a pixel arrangement, the method comprising:
- accumulating, during an exposure period and in a first integration period, charge carriers with a photodetector comprising the pixel arrangement;
- pulsing, during the exposure period and at an end of the first integration period, a transfer transistor to a first voltage level to transfer a portion of the accumulated charge carriers to a diffusion node, wherein the portion is configured to be drained to a supply voltage; and
- continuing to accumulate, during the exposure period and in a second integration period, charge carriers with the photodetector;
- pulsing, during a storage period, the transfer transistor to the first voltage level for transferring a first part of the accumulated charge carriers to the diffusion node;
- storing, during the storage period, a low conversion gain signal representing the first part of the accumulated charge carriers on at least a second capacitor coupled to the diffusion node;
- pulsing, during the storage period, the transfer transistor to a full voltage level for transferring a remaining part of the accumulated charge carriers to the diffusion node;
- storing, during the storage period, a high conversion gain signal representing the remaining part of the accumulated charge carriers on a first capacitor coupled to the diffusion node; and
- reading out, during a readout period, the low conversion gain signal and the high conversion gain signal stored on the capacitors.

10. The method according to claim 9, further comprising additional pulsing, during the exposure period and after the second integration period, the transfer transistor to a respective further voltage level, wherein, with each additional pulsing, an additional portion of the accumulated charge carriers is configured to be drained to the supply voltage, and wherein each additional pulsing is followed by an additional continuing to accumulate, in a respective additional integration period, charge carriers with the photodetector.

11. The method according to claim 10, wherein voltage levels at which successive pulses during the exposure period are applied are equal or decrease from pulse to pulse.

12. The method according to claim 10, further comprising:
- pulsing, during the storage period, the transfer transistor to the respective further voltage level for transferring a further part of the accumulated charge carriers to the diffusion node; and
- storing, during the storage period, a further signal representing the further part of the accumulated charge carriers on a further capacitor coupled to the diffusion node.

13. The method according to claim 12,
- wherein the further signal indicates a further calibration level based on the further part of the accumulated charge carriers, and
- wherein the method further comprises adjusting a pixel output signal depending on a further pixel specific knee point value that is determined based on the further calibration level.

14. The method according to claim 12, further comprising reading out, during the readout period, the further signal stored on the further capacitor, wherein reading the further signal comprises correlated double sampling.

15. The method according to claim 9, wherein integration periods following pulsing during the exposure period decrease from integration period to integration period.

16. The method according to claim 9, wherein the high conversion gain signal indicates a calibration level based on the remaining part of the accumulated charge carriers.

17. The method according to claim 16, further comprising adjusting a pixel output signal based on the low conversion gain signal and/or the high conversion gain signal depending on a pixel specific knee point value that is determined based on the calibration level.

18. The method according to claim 9, wherein reading the low conversion gain signal comprises double delta sampling, and wherein reading the high conversion gain signal comprises correlated double sampling.

19. A method for operating a pixel arrangement, the method comprising:
- accumulating, during an exposure period, charge carriers with a photodetector comprising the pixel arrangement; and
- performing the following operations during the accumulation:
  - first pulsing a transfer transistor to a first voltage level to transfer a portion of the accumulated charge carriers to a diffusion node, wherein the portion is configured to be drained to a supply voltage;
  - second pulsing the transfer transistor to the first voltage level for transferring a first part of the accumulated charge carriers to the diffusion node;
  - storing a low conversion gain signal representing the first part of the accumulated charge carriers on at least a second capacitor coupled to the diffusion node;
  - at an end of the exposure period, pulsing the transfer transistor to a full voltage level for transferring a remaining part of the accumulated charge carriers to the diffusion node;

after pulsing to the full voltage level, storing a high conversion gain signal representing the remaining part of the accumulated charge carriers on a first capacitor coupled to the diffusion node; and during a readout period, reading out the low conversion gain signal and the high conversion gain signal stored on the capacitors.

20. The method according to claim 19, further comprising, after first pulsing to the first voltage level and before second pulsing to the first voltage level, additionally pulsing the transfer transistor to a respective further voltage level for transferring a respective further portion of the accumulated charge carriers to the diffusion node, wherein the further portion is configured to be drained to the supply voltage.

* * * * *